US012669937B2

(12) United States Patent
    Kim et al.

(10) Patent No.: US 12,669,937 B2
(45) Date of Patent: Jun. 30, 2026

(54) STORAGE DEVICE USING HOST MEMORY BUFFER AND METHOD OF OPERATING THE SAME

(71) Applicant: SAMSUNG ELECTRONICS CO., LTD., Suwon-si (KR)

(72) Inventors: Jongmin Kim, Suwon-si (KR); Kyungsik Um, Suwon-si (KR); Minsik Oh, Suwon-si (KR); Donggil Kang, Suwon-si (KR); Jinwoo Song, Suwon-si (KR); MyungGwan Jeong, Suwon-si (KR); Kyungjune Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 77 days.

(21) Appl. No.: 18/531,162

(22) Filed: Dec. 6, 2023

(65) Prior Publication Data

US 2024/0338124 A1    Oct. 10, 2024

(30) Foreign Application Priority Data

Apr. 10, 2023    (KR) ........................ 10-2023-0047113

(51) Int. Cl.
    *G06F 3/06* (2006.01)
    *G11C 29/18* (2006.01)
(52) U.S. Cl.
    CPC .......... *G06F 3/0613* (2013.01); *G06F 3/0659* (2013.01); *G06F 3/0673* (2013.01); *G11C 29/18* (2013.01)

(58) Field of Classification Search
    CPC .... G06F 3/0613; G06F 3/0659; G06F 3/0679; G11C 29/18
    See application file for complete search history.

(56) References Cited

U.S. PATENT DOCUMENTS

| | | | |
|---|---|---|---|
| 9,123,409 B2 | 9/2015 | Eilert et al. | |
| 10,558,367 B2 | 2/2020 | Benisty | |
| 10,712,949 B2 | 7/2020 | Hahn et al. | |
| 10,860,508 B2 | 12/2020 | Bolkhovitin et al. | |
| 11,294,825 B2 | 4/2022 | Byun et al. | |
| 11,409,465 B2 | 8/2022 | Nimmagadda et al. | |

(Continued)

OTHER PUBLICATIONS

Kim, Kyusik, Eunji Lee, and Taeseok Kim. "HMB-SSD: Framework for efficient exploiting of the host memory buffer in the NVMe SSD." IEEE Access 7 (2019): 150403-150411. (Year: 2019).*

(Continued)

*Primary Examiner* — Nicholas J Simonetti
(74) *Attorney, Agent, or Firm* — Fish & Richardson P.C.

(57) ABSTRACT

A method of operating a storage device using a host memory buffer of a host includes: recording information on HMB addresses on the host memory buffer, respectively corresponding to a plurality of read requests for the host memory buffer, in an address information table when the plurality of read requests are required; transmitting the plurality of read requests to the host memory buffer, regardless of a response of the host memory buffer; receiving a plurality of pieces of read data, respectively corresponding to the plurality of read requests, from the host memory buffer; detecting an error of each of the plurality of pieces of read data; and updating the address information table based on a result of the error detection.

20 Claims, 18 Drawing Sheets

(56)         References Cited

U.S. PATENT DOCUMENTS

| | | | |
|---|---|---|---|
| 2016/0162416 | A1 | 6/2016 | Boyd et al. |
| 2019/0146709 | A1* | 5/2019 | Im ......................... G06F 3/0685 |
| | | | 711/103 |
| 2020/0110677 | A1* | 4/2020 | Kim .................... G06F 12/0868 |
| 2020/0151040 | A1 | 5/2020 | Lee et al. |
| 2020/0151055 | A1* | 5/2020 | Eom ....................... G06F 13/28 |
| 2022/0229586 | A1 | 7/2022 | Benisty et al. |
| 2022/0283949 | A1 | 9/2022 | Ray et al. |
| 2022/0350755 | A1 | 11/2022 | Hahn et al. |

OTHER PUBLICATIONS

Extended European Search Report in European Appln. No. 24165870.
7, mailed on Aug. 13, 2024, 5 pages.

* cited by examiner

Figure 6B:
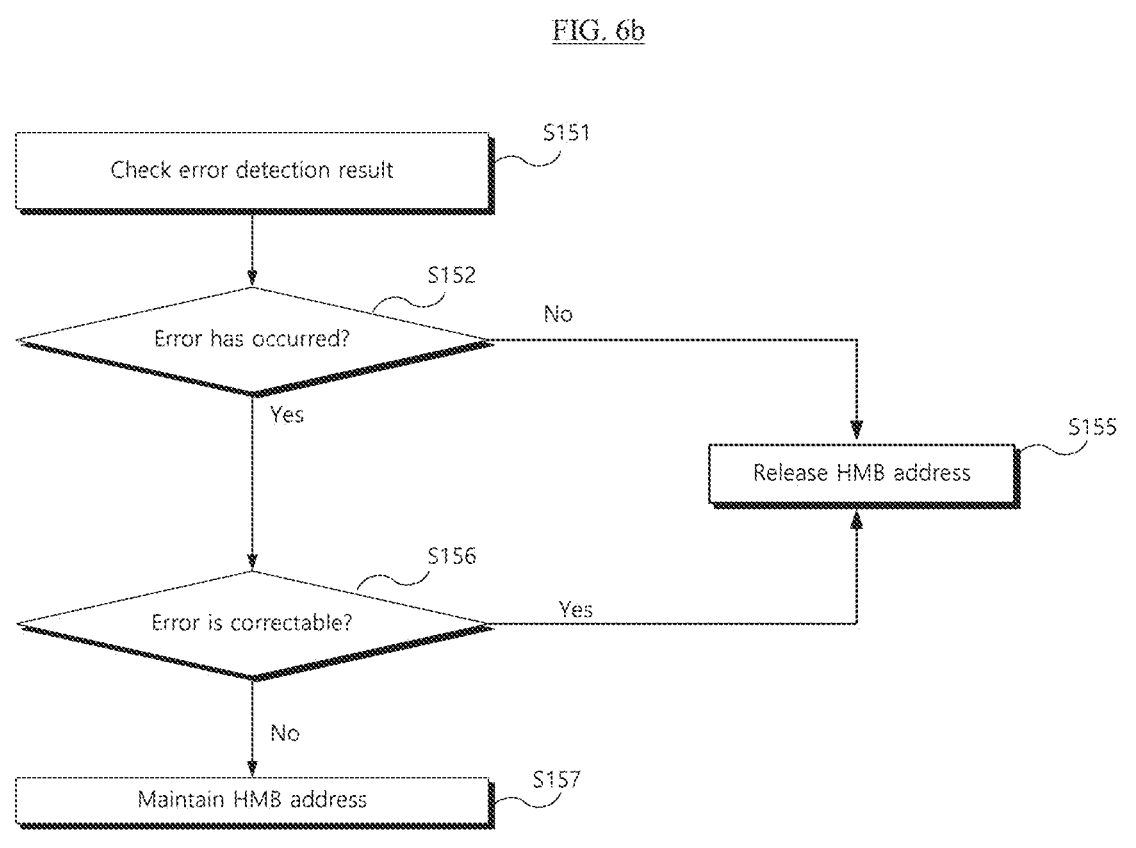

Check error detection result — S151

Error has occurred? — S152

No

Yes

Release HMB address — S155

Error is correctable? — S156

Yes

No

Maintain HMB address — S157

Figure 8A:
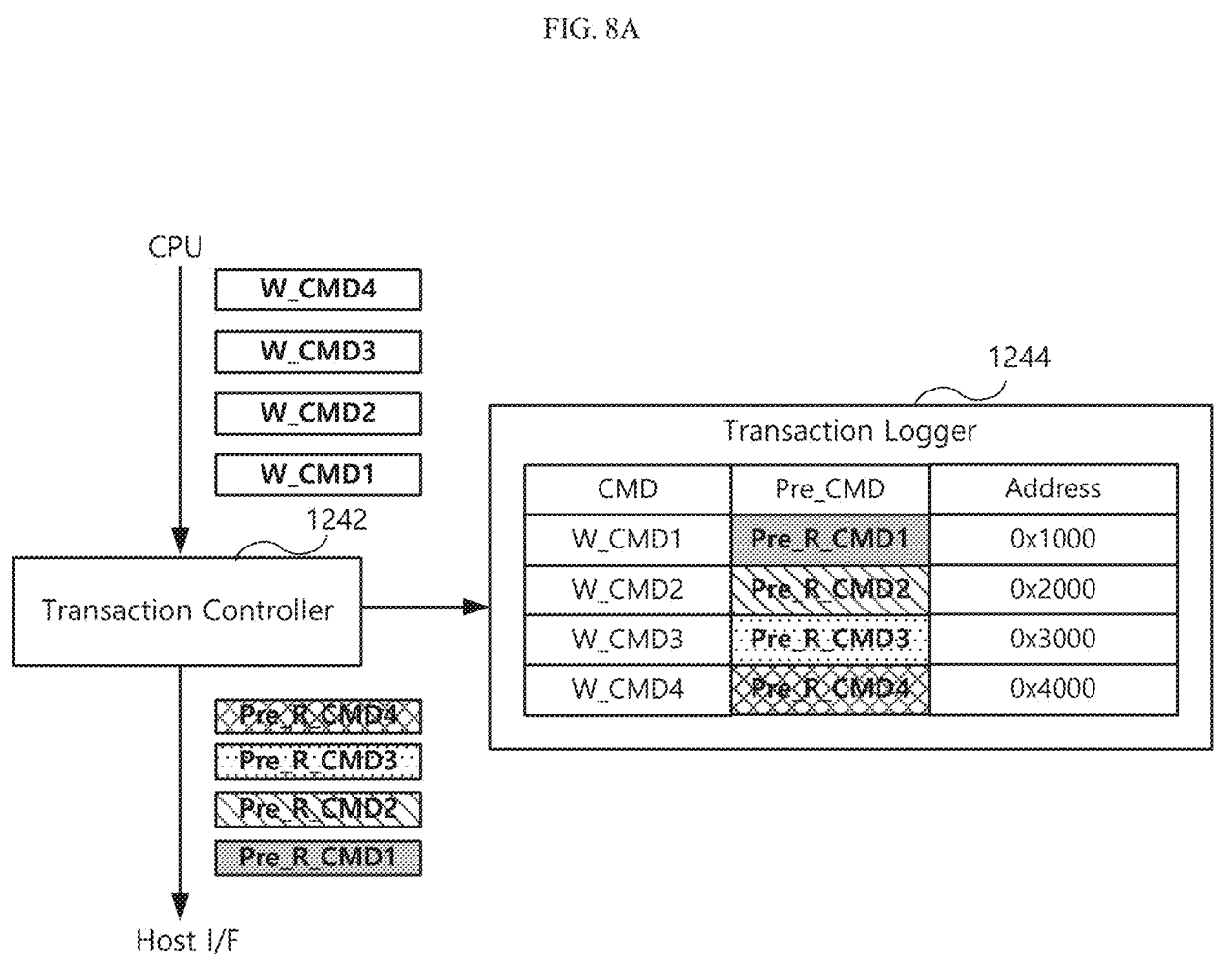

Transaction Logger

| CMD | Pre_CMD | Address |
|---|---|---|
| W_CMD1 | Pre_R_CMD1 | 0x1000 |
| W_CMD2 | Pre_R_CMD2 | 0x2000 |
| W_CMD3 | Pre_R_CMD3 | 0x3000 |
| W_CMD4 | Pre_R_CMD4 | 0x4000 |

CPU

W_CMD4

W_CMD3

W_CMD2

W_CMD1

1242

Transaction Controller

Pre_R_CMD4

Pre_R_CMD3

Pre_R_CMD2

Pre_R_CMD1

Host I/F

Figure 15:
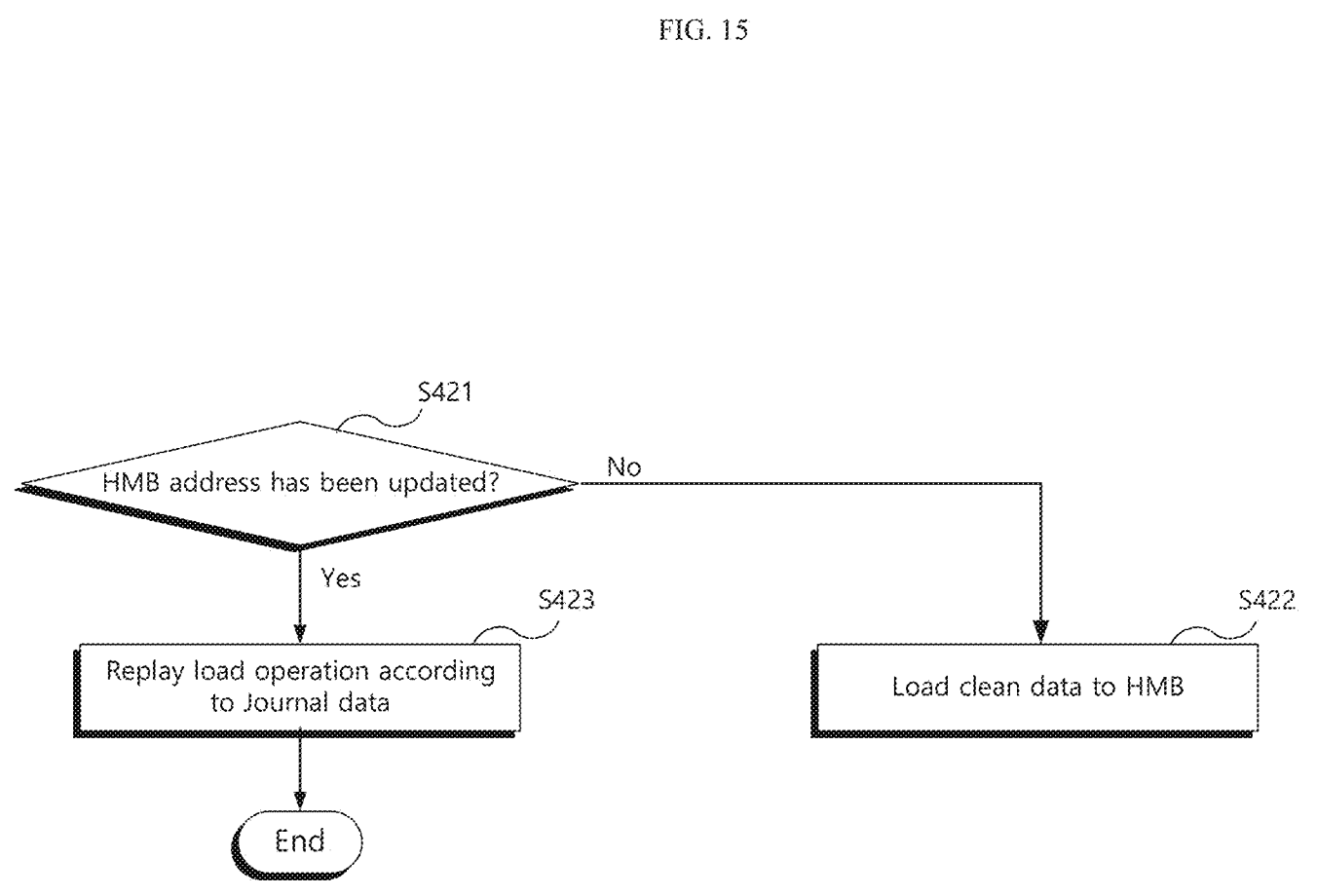

HMB address has been updated?

No

Yes

S422

Load clean data to HMB

S423

Replay load operation according to journal data

End

STORAGE DEVICE USING HOST MEMORY BUFFER AND METHOD OF OPERATING THE SAME

CROSS-REFERENCE TO RELATED APPLICATION(S)

This application claims benefit of priority to Korean Patent Application No. 10-2023-0047113, filed on Apr. 10, 2023, in the Korean Intellectual Property Office, the disclosure of which is incorporated herein by reference in its entirety.

BACKGROUND

The present disclosure relates to a storage device, and more particularly, to a storage device using fa host memory buffer and a method of operating the same.

A storage system includes a host and a storage device. The host may allocate a portion of a memory area in the host to the storage device, and the allocated memory area may be referred to as, for example, a host memory buffer (HMB). A storage device, including a flash memory or a nonvolatile memory, may improve performance of an entire storage system using such a host memory buffer.

Recently, research into technology for efficiently using a host memory buffer (HMB) has been actively conducted. For example, there is increasing demand for a host memory buffer access method which may secure reliability of data while preventing performance degradation caused by a latency.

SUMMARY

The present disclosure provides a storage device for securing reliability of data while preventing performance degradation caused by a latency during an access of the storage device to a host memory buffer.

For example, a storage device according to the present disclosure transmits a plurality of read requests regardless of receiving a response from a host memory buffer. The storage device writes a location of the host memory buffer for the plurality of read requests and retains a location of a buffer in which an error has occurred. Thus, reliability of data may be secured while preventing performance degradation caused by a long latency.

As another example, before the storage device transmits a plurality of write requests, a read access request takes precedence over a location on a host memory buffer corresponding to the plurality of write requests, and the storage device identified a health, e.g., whether there is an abnormality, of the location. Only when there is no abnormality, a write request may be transmitted.

As another example, when a data recovery operation is performed in a location in which an error has occurred, the storage device determines whether the location is "dirty," e.g., a mismatch between the mapping data stored in the host memory buffer and the mapping data stored in the nonvolatile memory device has occurred in the location in which the error occurred. If the location is dirty, data of the location may be recovered based on journal data when an update has occurred.

As another example, read access is requested once more to a location in which recovery has been completed. Consequently, if an error occurs again in the location, the location is marked as a bad region and is no longer used, resulting in a reduced recovery overhead.

BRIEF DESCRIPTION OF DRAWINGS

FIG. 4A is a diagram illustrating an example of an operation of an HMB controller when a plurality of read requests are transmitted to the host memory buffer.

FIG. 6B is a flowchart illustrating another example of operation S150 of FIG. 5.

FIG. 8A is a diagram illustrating an example of an operation of an HMB controller transmitting a plurality of preliminary read requests, corresponding to a plurality of write requests, to a host memory buffer.

FIG. 12 is a diagram illustrating an example of an operation of an HMB controller of FIG. 11.

FIG. 15 is a flowchart illustrating an example of operation S420 of FIG. 14.

DETAILED DESCRIPTION

Figure 1:
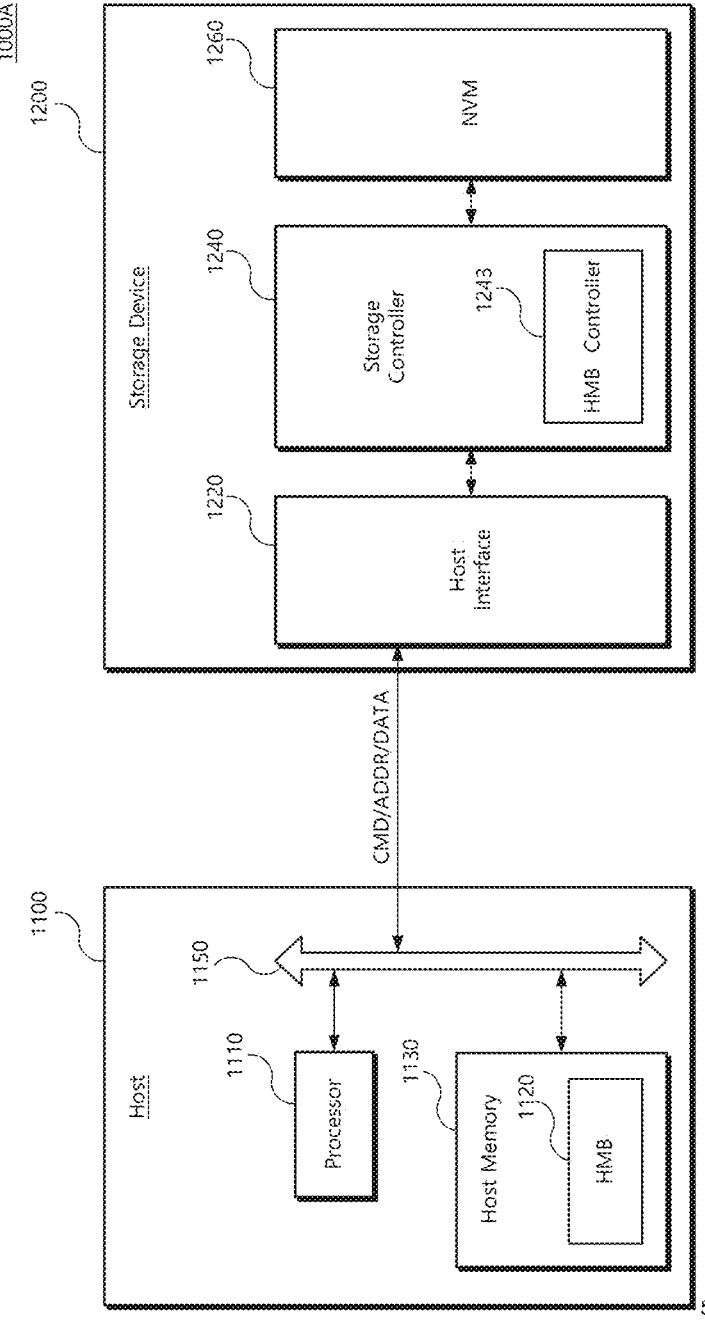
FIG. 1 is a block diagram illustrating an example of a storage system.

FIG. 1 is a block diagram illustrating an example storage system 1000A. Referring to FIG. 1, the storage system 1000A includes a host 1100 and a storage device 1200.

The storage system 1000A may support a host memory buffer function to share a portion of the host memory 1130 with the storage device 1200. Accordingly, the storage device 1200 may allocate a portion of the host memory 1130 of the host 1100 as a memory buffer, and the allocated buffer may be referred to as the host memory buffer 1120.

The storage device 1200 may load data to be used from the nonvolatile memory device 1260 into the host memory buffer 1120, and may then read the data from the host memory buffer 1120 to use the data. Also, the storage device 1200 may write new data in the host memory buffer 1120 to update data stored in the host memory buffer 1120. The storage device 1200 may periodically flush the data, stored in the host memory buffer 1120, to the nonvolatile memory device 1260 to perform data synchronization.

The storage device 1200 may transmit a plurality of read requests to the host memory buffer 1120. In this case, the storage device 1200 may transmit a subsequent read request to the host memory buffer 1120 regardless of a response of the host memory buffer 1120 to a read request transmitted first, e.g., the storage device 1200 may transmit the subsequent read request to the host memory buffer 1120 even if the host memory buffer 1120 has not responded. Accordingly, a speed of access to the data stored in the host memory buffer 1120 may be increased to improve a data processing speed of the storage device 1200.

Also, the storage device 1200 may record HMB addresses on the host memory buffer 1120, respectively corresponding to a plurality of read requests, and may detect whether read data corresponding to the plurality of read requests is damaged. When damage to read data is detected, the storage device 1200 may recover the damaged data using the recorded HMB address.

Accordingly, a speed of access to data of the host memory buffer 1120 may be improved and reliability of the data may be secured.

The host 1100 may write data in the storage device 1200 or read data stored in the storage device 1200. To this end, the host 1100 may transmit a command CMD, an address ADDR, and data DATA to write data in the storage device 1200. Also, the host 1100 may transmit a command CMD and an address ADDR to read data stored in the storage device 1200 to the storage device 1200. The host 1100 includes a processor 1110, a host memory 1130, and an interface circuit 1150.

The processor 1110 may control the overall operation of the host 1100. The processor 110 may generate a request to write data in the storage device 1200 or a request to read data from the storage controller 200, and may transmit the request to the storage device 1200 through the interface circuit 1150.

An application program, a file system, a device driver, or the like, may be loaded into the host memory 1130. In addition, various types of software or data driven by the host 1100 may be loaded into the host memory 1130. For example, the host 1100 may allocate a portion of the host memory 1130 as the host memory buffer 1120 serving as a buffer of the storage device 1200.

The host memory buffer 1120 may be an area in which a portion of an area of the host memory 1130 is allocated to the storage device 1200 to be used by that the storage device 1200. For example, when the host memory buffer 1120 is allocated to the storage device 1200, the host memory buffer 1120 may be provided to be exclusively used by the storage device 1200.

The host memory buffer 1120 may store mapping data for mapping an address of the nonvolatile memory device 1260 and management data for managing or controlling storage device 1200. In some implementations, user data to be written in the storage device 1200 may be temporarily stored.

The interface circuit 1150 may provide an electrical connection between the host 1100 and the storage device 1200. For example, the interface circuit 1150 may convert commands, addresses, data, or the like, corresponding to various requests issued by the host 1100, in a manner of interfacing with the storage device 1200. A protocol of the interface circuit 1150 may include at least one of a UFS (Universal Flash Storage), an SCSI (Small Computer System Interface), an SAS (Serial Attached SCSI), an SATA (Serial Advanced Technology Attachment), a PCIe (Peripheral Component Interconnect Express), an eMMC (embedded MultiMediaCard), a FC (Fiber Channel), an ATA (Advanced Technology Attachment), an IDE (Integrated Drive Electronics), a USB (Universal Serial Bus), an IEEE 1394 (Firewire). However, example implementations are not limited thereto, and the protocol may include any other protocols allowing data to be exchanged between the host 1100 and the storage device 1200.

The storage device 1200 may be provided as data storage of the host 1100. Also, the storage device 1200 may allocate a portion of the host memory 1130 of the host 1100 as the host memory buffer 1120, and may equivalently use the host memory buffer 1120 as an internal buffer. The storage device 1200 may include a host interface 1220, a storage controller 1240, and a nonvolatile memory device 1260.

The host interface 1220 may serve as a communication channel of the storage device 1200 for data exchange with the host 1100. The host interface 1220 may have an interfacing protocol through which the host memory buffer 1120 may support a buffer function of the storage device 1200. For example, the host interface 1220 may provide an interfacing scheme for sharing memory resources of the host 1100 and memory resources of the storage device 2100. For example, the host interface 1220 may allow the storage controller 1240 to manage the host memory buffer 1120 and an internal buffer of the storage device 1200 with a single memory map.

The storage controller 1240 may control the overall operation of the storage device 1200. Also, the storage controller 1240 may control transactions for the host memory buffer 1120. To this end, the storage controller 1240 may include an HMB controller 1243. A transaction for the host memory buffer 1120 may include a read request to read data stored in the host memory buffer 1120 and a write request to write data to the host memory buffer 1120.

For example, the HMB controller 1243 may transmit a read request to the host memory buffer 1120 to reference data stored in the host memory buffer 1120. In this case, the HMB controller 1243 may transmit a plurality of read requests to the host memory buffer 1120.

When transmitting a plurality of read requests to the host memory buffer 1120, the HMB controller 1243 may continuously transmit subsequent read requests to the host memory buffer even if there is no response of the host memory buffer 1120 to a request transmitted first. Also, the HMB controller 1243 may record information on HMB addresses on the host memory buffer 1120, respectively corresponding to a plurality of read requests. The recorded information on the HMB addresses may be used to recover corresponding data when damage to read data corresponding to the plurality of read requests is detected. Accordingly, the reliability of the data may be secured while improving a processing speed of the transaction for the host memory buffer 1120.

The nonvolatile memory device 1260 may be provided as a storage medium of the storage device 1200. The nonvolatile memory device 1260 may include a flash memory, a magnetic random access memory (MRAM), a phase-change random access memory (PRAM), a ferroelectric random access memory (FeRAM), or resistive RAM (ReRAM), but example implementations are not limited thereto.

As described above, the storage device 1200 may transmit a plurality of transaction requests to the host memory buffer 1120 regardless of whether the host memory buffer 1120 makes a response, and may record the information on the HMB addresses on the host memory buffer 1120, corresponding to each of the plurality of transactions. In addition, when damage to the data received and corresponding to the plurality of transactions is detected, the storage device 1200 may recover the data using the recorded HMB addresses on the host memory buffer 1120. Accordingly, the reliability of the data may be secured while improving the processing speed of transactions for the host memory buffer 1120.

Figure 2:
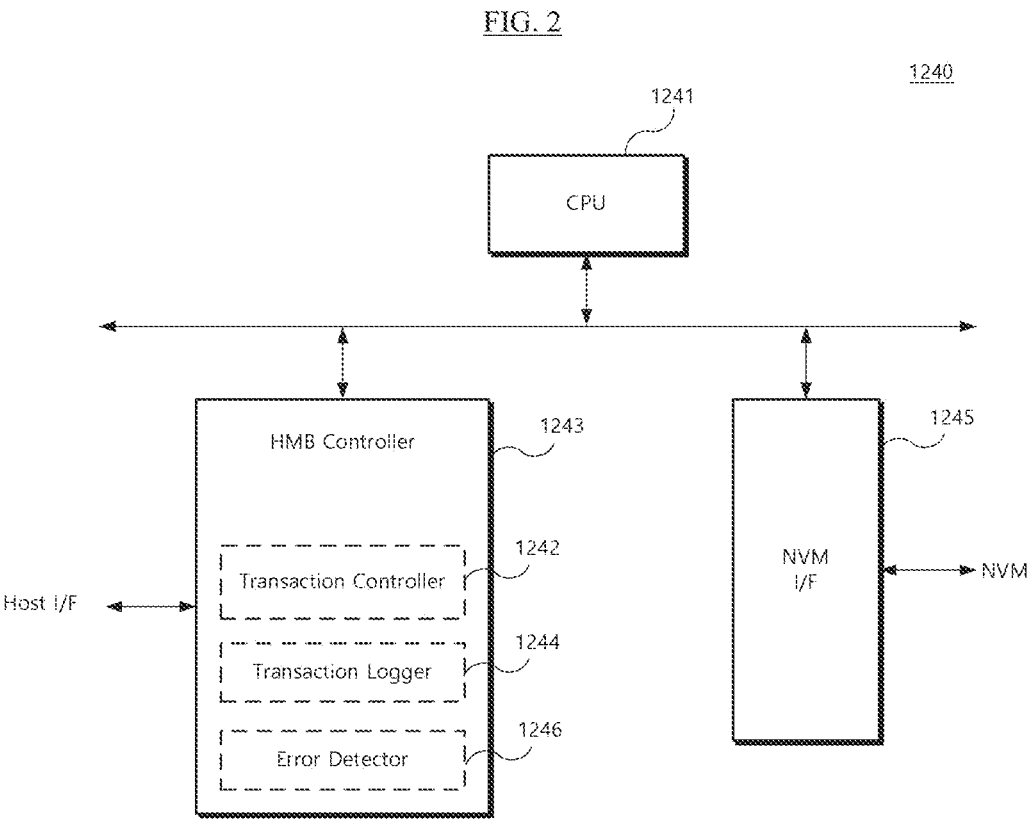
FIG. 2 is a block diagram illustrating an example of a configuration of a storage controller of FIG. 1.

FIG. 2 is a block diagram illustrating an example of a configuration of the storage controller 1240 of FIG. 1. Referring to FIG. 2, the storage controller 1240 includes a central processing unit (CPU) 1241, an HMB controller 1243, and a flash interface 1245.

The CPU 1241 may control the overall operation of the storage device 1200. For example, the CPU 1241 may control the HMB controller 1243 and the flash interface 1245 to write data in the nonvolatile memory device 1260 or read data stored in the nonvolatile memory device 1260 in response to a command from the host 1100.

The HMB controller 1243 may control a transaction for the host memory buffer 1120 to write data in the host memory buffer 1120 or read data from the host memory buffer 1120 according to a request of the CPU 1241. A transaction for the host memory buffer 1120 may include a read request and a write request for the host memory buffer 1120.

The HMB controller 1243 may receive data, corresponding to each of a plurality of transactions, from the host memory buffer 1120, detect whether the received data is damaged, and collect the HMB addresses on the host memory buffer 1120 corresponding to the damaged data. To this end, the HMB controller 1243 may include a transaction controller 1242, a transaction logger 1244m and an error detector 1246.

The transaction controller 1242 may control a plurality of transactions for the host memory buffer 1120. For example, the transaction controller 1242 may control a read request or a write request for the host memory buffer 1120.

In some implementations, when a plurality of read requests need to be transmitted to the host memory buffer 1120, the transaction controller 1242 may transmit the plurality of read requests to the host memory buffer 1120 without waiting for a response from the host memory buffer 1120.

For example, the CPU 1241 may provide the transaction controller 1242 with a plurality of read requests for reading data stored in the host memory buffer 1120. The transaction controller 1242 may transmit the plurality of read requests, provided by the CPU 1241, to the host memory buffer 1120 without delay. In this case, the transaction controller 1242 may transmit each of the plurality of read requests, provided by the CPU 1241, to the host memory buffer 1120 upon receipt thereof. However, in some implementations, the transaction controller 1242 may substantially simultaneously transmit the plurality of read requests provided by the CPU 1241, or may contemporaneously transmit the plurality of read requests, provided by the CPU 1241, in parallel.

When a plurality of read requests are received from the transaction controller 1242, the host memory buffer 1120 may transmit read data, corresponding to each read request, to the storage device 1200.

The transaction controller 1242 may receive a plurality of read data corresponding to a plurality of read requests from the host memory buffer 1120, and may then match the plurality of read data with the plurality of read requests. The transaction controller 1242 may provide a result of the matching to the CPU 1241.

In addition, in some implementations, when a write request needs to be transmitted to the host memory buffer 1120, the transaction controller 1242 may perform an operation of reading data on the HMB addresses on the host memory buffer, corresponding to the write request, before transmitting the write request.

For example, the CPU 1241 may provide the transaction controller 1242 with a write request to write data to a specific HMB address on the host memory buffer 1120. In this case, the transaction controller 1242 may not directly transmit the write request to the host memory buffer 1120. For example, the transaction controller 1242 may transmit a read request for the specific HMB address of the host memory buffer 1120 to the host memory buffer 1120 before transmitting the write request to the host memory buffer 1120. A read request for the HMB address of the host memory buffer 1120, a target of a write request, before transmission of the write request may be referred to as a "preliminary read request."

The transaction controller 1242 may receive preliminary read data, corresponding to the preliminary read request, from the host memory buffer 1120. The transaction controller 1242 may identify that damage to the preliminary read data is not present and may then transmit a write request for the specific HMB address to the host memory buffer 1120. As described above, integrity of a location of the host memory buffer 1120, the target of the write request, may be identified first, and an occurring during a write access to the host memory buffer 1120 may be reduced as the write request is transmitted.

The transaction logger 1244 may manage HMB address information on the host memory buffer 1120 for each of a plurality of transactions. For example, the transaction logger 1244 may manage an HMB address on the host memory buffer 1120, targeted by a read request, or may manage an HMB address on the host memory buffer 1120 targeted by a write request.

In some implementations, when a plurality of read requests for the host memory buffer 1120 are provided from the CPU 1241, the transaction logger 1244 may record the HMB address on the host memory buffer 1120, target by each of the plurality of read requests, in an address information table. In this case, the transaction logger 1244 may match the plurality of read requests with corresponding HMB addresses and may record a result of the matching in the address information table.

In some implementations, when a plurality of write requests for the host memory buffer 1120 are provided from the CPU 1241, the transaction logger 1244 may record an HMB address on the host memory buffer 1120, targeted by each of the plurality of write requests, in the address information table. In this case, the transaction logger 1244 may match the plurality of write requests with corresponding HMB addresses and may record a result of the matching in the address information table. In some implementations, the transaction logger 1244 may also match preliminary read requests for each HMB address together and may record a result of the matching in the address information table.

The error detector 1246 may detect an error in each read data received from the host memory buffer 1120. To this end, when data is written in the host memory buffer 1120, checking data may be written together. The checking data may include at least one of an error correction code (ECC) parity and cyclic redundancy checking (CRC).

The error detector 1246 may detect an error using the read test data when reading data from the host memory buffer 1120. In some implementations, the checking data may be ECC parity and CRC parity, and the error detector 1246 may detect an error using ECC parity and CRC parity decoded through a decoding operation. In this case, the decoding operation may be performed by an ECC decoder and a CRC decoder, and the ECC decoder and the CRC decoder may be disposed in the HMB controller 1243.

In some implementations, the error detector 1246 may determine whether a detected error is a correctable error. For example, the detected error may be an error which is correctable using the ECC parity and/or the CRC parity by an error correction block, or the like. Alternatively, the detected error may be an error which is uncorrectable even by the error correction block, or the like. The error correction block may be disposed in the HMB controller 1243 to receive information on an error detected from the error detector 1246 and to provide information on whether the error is correctable, to the error detector 1246. However, example implementations are not limited thereto, and the error detector 1246 may determine the detected error to be uncorrectable when the amount of a detected error bit is larger than a predetermined reference.

The error detector 1246 may transmit information on whether a corresponding error is correctable, together with an error detection result, to the transaction logger 1244.

The transaction logger 1244 may update the address information table based on the error detection result of the error detector 1246.

For example, an error may be detected in a portion of a plurality of pieces of read data, received from the host memory buffer 1120, in response to a plurality of read requests. In this case, the transaction logger 1244 may release an HMB address, corresponding to read data in which an error has not been detected, and may maintain an HMB address corresponding to read data in which an error has been detected. For example, the transaction logger 1244 may maintain only the HMB address, corresponding to read data in which an error has been detected, in the address information table. Such corrected HMB addresses may be used when the corresponding data is recovered.

In some implementations, the transaction logger 1244 may update the address information table based on an error detection result of the error detector 1246 and whether the detected error is correctable.

For example, the transaction logger 1244 may release an HMB address corresponding to read data in which an error has not been detected and an HMB address corresponding to read data in which an error has been detected but is correctable. The transaction logger 1244 may maintain an HMB address corresponding to read data in which an uncorrectable error has been detected.

As described above, the storage controller 1240 may transmit a plurality of transaction requests to the host memory buffer 1120 regardless of whether the host memory buffer 1120 makes a response, and may record information on HMB addresses on the host memory buffer 1120, respectively corresponding to a plurality of transactions. The information on such recorded HMB addresses may be used to recover the corresponding data when damage to read data corresponding to a plurality of read requests is detected. Accordingly, reliability of data may be secured while improving a transaction processing speed for the host memory buffer 1120. In addition, integrity of a location of the host memory buffer 1120, a target of the write request, may be checked before a write request is transmitted to the host memory buffer 1120, and an error occurring during a write access to the host memory buffer 1120 may be reduced as the write request is transmitted.

Figure 3:
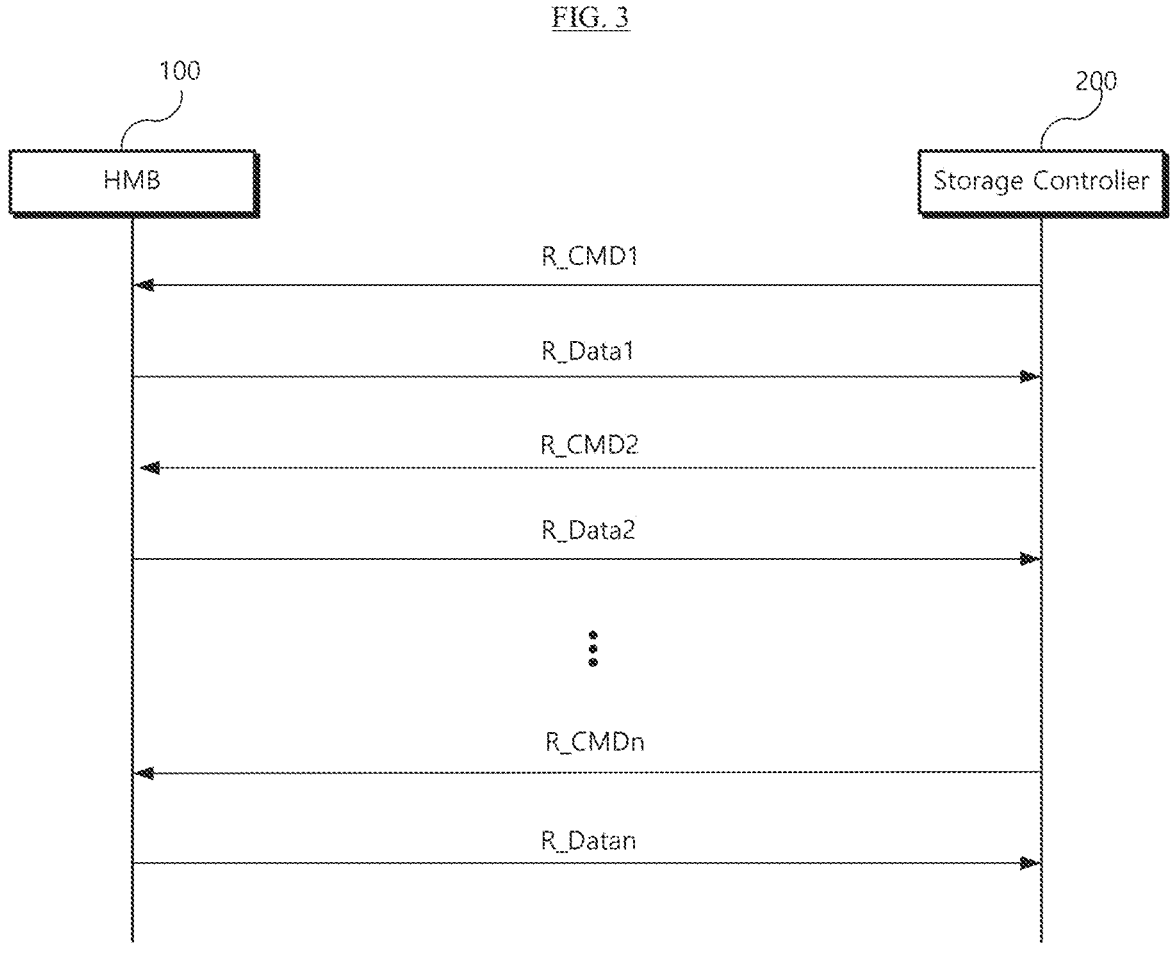
FIG. 3 is a diagram illustrating an example of a process of transmitting a read request to a host memory buffer according to the related art.

FIG. 3 is a diagram illustrating an example of a process of transmitting a read request to a host memory buffer in the related art.

In FIG. 3, it is assumed that the storage controller 200 transmits first to $n^{th}$ read requests to read data from the host memory buffer 100.

Continuing to refer to FIG. 3, the storage controller 200 transmits a first read request R_CMD1. The storage controller 1240 may receive first read data R_Data1, corresponding to the first read request R_CMD1, from the host memory buffer 1120. As described above, the storage controller 200 may receive a response to the first read request R_CMD1, and may then transmit a subsequent read request, for example, a second read request R_CMD2.

Similarly, the storage controller 200 may receive a response to a $n-1^{th}$ read request, and may then transmit the $n^{th}$ read request to the host memory buffer 100. In some implementations, the storage controller 200 transmits the $n^{th}$ read request to the host memory buffer 100 without receiving a response to a $n-1^{th}$ read request.

As described in FIG. 3, when a subsequent transaction is transmitted only in the case in which a response is received from the host memory buffer 100 for a single transaction, performance degradation may occur due to a long latency as the host memory buffer 100 processes a single outstanding transaction.

Meanwhile, the storage controller 1240 of FIG. 2 may continuously transmit a plurality of transaction requests to the host memory buffer 1120 regardless of whether the host memory buffer 1120 makes a response. Accordingly, a speed of access to data stored in the host memory buffer 1120 may be increased. In addition, the storage controller 1240 of FIG. 2 may collect all HMB addresses on the host memory buffer 1120 corresponding to data in which an error has occurred, and may recover the erroneous data using the collected HMB addresses. Accordingly, reliability of data may also be secured.

Figure 4A:
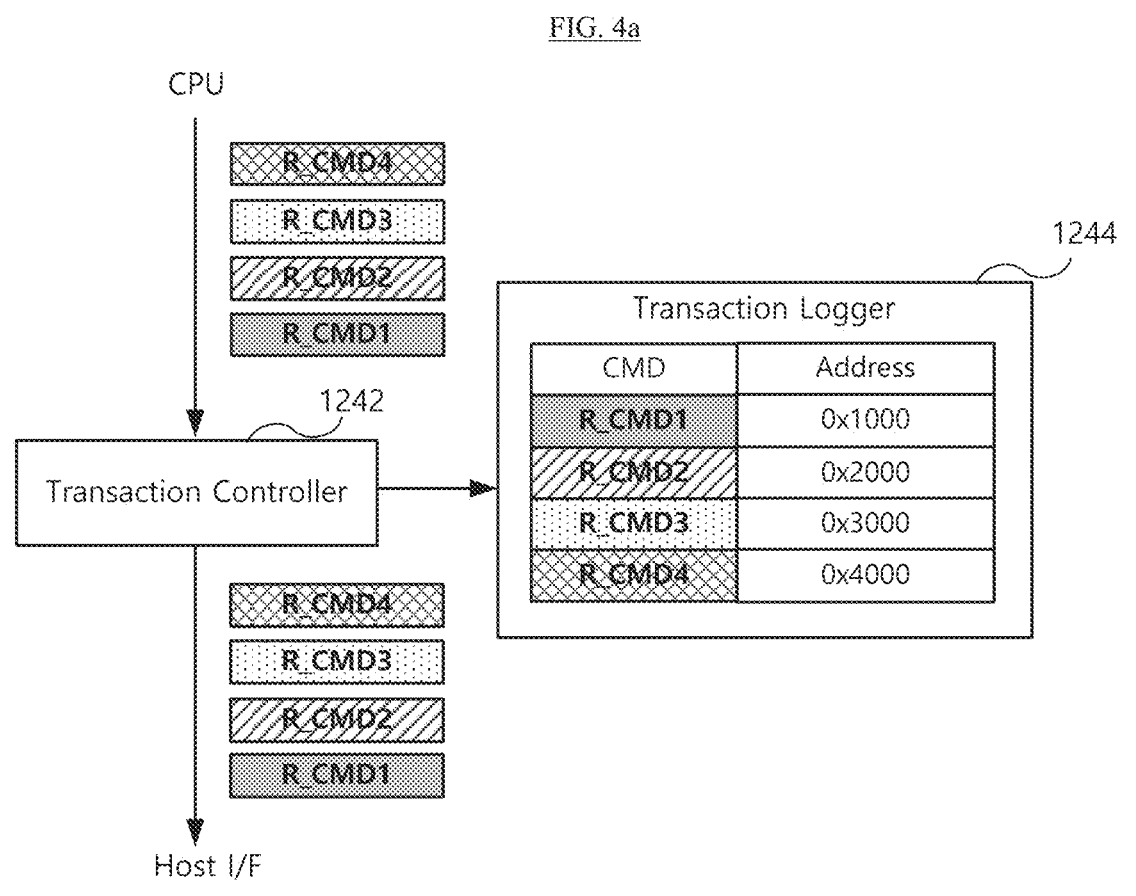
Figure 4B:
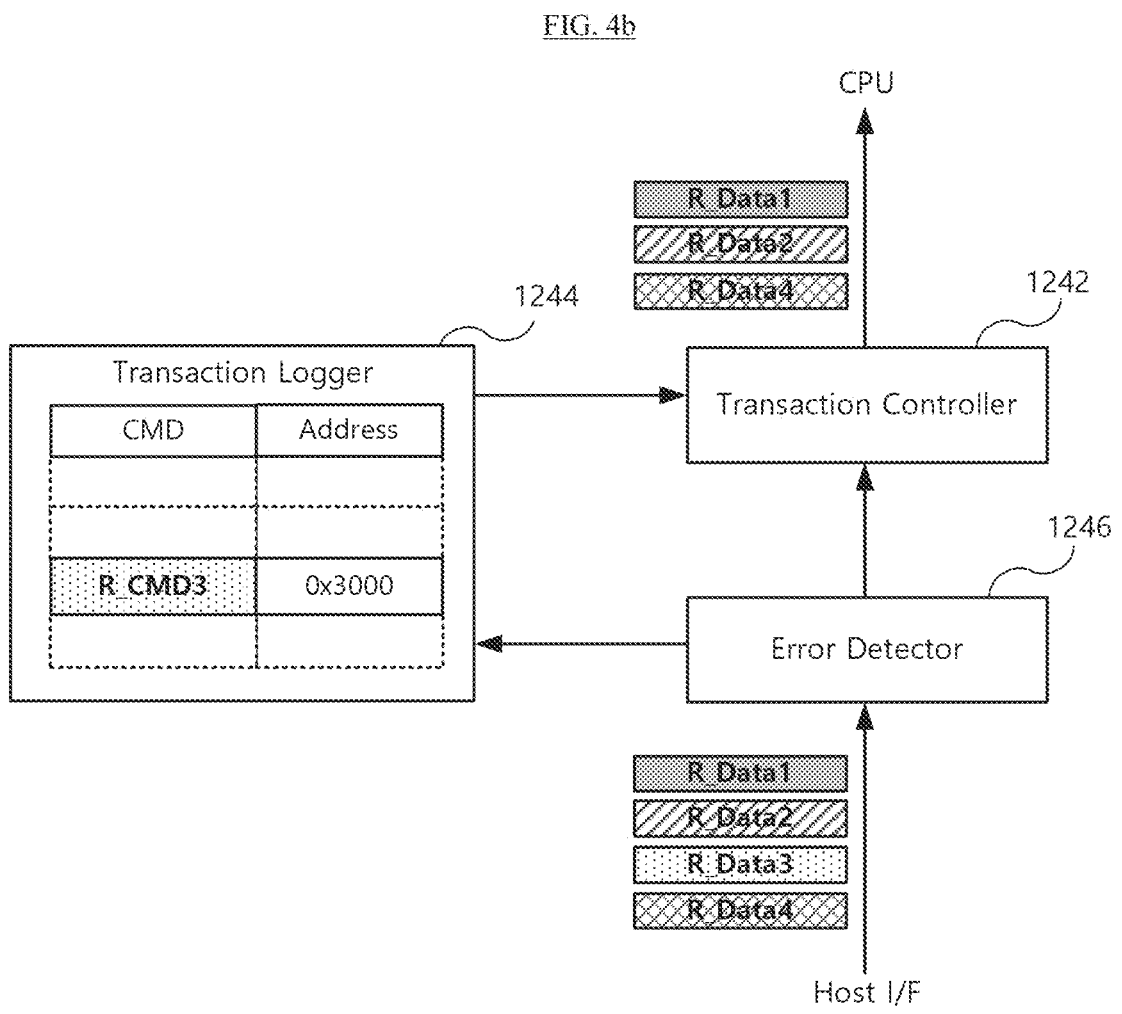
FIG. 4B is a diagram illustrating an example of an operation of an HMB controller when a plurality of pieces of read data are received from the host memory buffer.

FIGS. 4A and 4B are diagrams illustrating an example of an operation of the HMB controller 1243 of FIG. 2. For example, FIG. 4A illustrates an operation of the HMB controller 1243 when a plurality of read requests are transmitted to the host memory buffer 1120, and FIG. 4B illustrates an operation of the HMB controller 1243 when a plurality of pieces of read data are received from the host memory buffer 1120.

Referring to FIG. 4A, when data stored in first to fourth HMB addresses of the host memory buffer 1120 needs to be referenced, the CPU 1241 may transmit a first read request R_CMD1 to a fourth read request R_CMD4 to the transaction controller 1242.

The transaction controller 1242 may transmit each of the first read request R_CMD1 to the fourth read request R_CMD4 to the host interface 1220 upon receipt thereof.

Also, the transaction controller 1242 may queue the first read request R_CMD1 to the fourth read request R_CMD4 through the transaction logger 1244, and may record an HMB address for each request.

For example, the transaction controller 1242 may provide information on the first to fourth read requests R_CMD1 to R_CMD4 to the transaction logger 1244. The transaction logger 1244 may map each of the first read request R_CMD1 to the fourth read request R_CMD4 to a corresponding HMB address on the host memory buffer 1120, and may record the mapped request. A table, in which each read request and a corresponding HMB address is recorded, may be referred to as an address information table.

For ease of description, it is assumed that the first HMB address is 0x1000, the second HMB address is 0x2000, the third HMB address is 0x3000, and the fourth HMB address is 0x4000. In this case, the transaction logger 1244 may map the first read request R_CMD1 to the first HMB address 0x1000, map the second read request R_CMD2 to the second HMB address 0x2000, map the third read request R_CMD3 to a third HMB address 0x3000, and map a fourth read request R_CMD4 to a fourth HMB address 0x4000.

In FIG. 4A, the transaction controller 1242 is illustrated as sequentially transmitting the first read request R_CMD1 to the fourth read request R_CMD4 from the CPU 1241 to the host memory buffer 1120, but example implementations are not limited thereto. For example, the transaction controller 1242 may transmit the first read request R_CMD1 to the fourth read request R_CMD4 in parallel.

Referring to FIG. 4B, the host memory buffer 1120 may receive the first read request R_CMD1 to the fourth read request R_CMD4. In response thereto, the host memory buffer 1120 may transmit first read data R_Data1 to fourth read data R_Data4 to the host interface 1220.

The host interface 1220 may transmit the received first read data R_Data1 to fourth read data R_Data4 to the error detector 1246.

The error detector 1246 may perform an error detection operation on each of the first to fourth read data R_Data1 to R_Data4. The error detector 1246 may perform an error detection operation using checking data included in each of the first to fourth read data R_Data1 to R_Data4.

In some implementations, the checking data may include ECC parity and CRC parity and may be included in each of the first read data R_Data1 to the fourth read data R_Data4. An encoded ECC parity and an encoded CRC parity may be decoded by an ECC decoder and a CRC decoder, respectively. The ECC decoder and the CRC decoder may be disposed in the HMB controller 1243.

The error detector 1246 may detect an error of each read data using the decoded ECC parity and the decoded CRC parity. The error detector 1246 may transmit a result of the error detection to the transaction logger 1244.

For ease of description, it is assumed that an error is detected in the third read data R_Data3 in FIG. 4B. In this case, the transaction logger 1244 may release HMB address information corresponding to the first read data R_Data1, the second read data R_Data2, and the fourth read data R_Data4 in which no error has been detected.

For example, the transaction logger 1244 may delete the first HMB address 0x1000, the second HMB address 0x2000, and the fourth HMB address 0x4000 from the address information table. In this case, information on the first read request R_CMD1, the second read request R_CMD2, and the fourth read request R_CMD4, respectively mapped to the first HMB address 0x1000, the second HMB address 0x2000, and the fourth HMB address 0x4000, may also be deleted together.

The transaction logger 1244 may maintain information on the third read request R_CMD3 corresponding to the third read data R_Data3, in which an error has been detected, and the third HMB address 0x3000. The transaction logger 1244 may collect HMB address information on the host memory buffer 1120 corresponding to read data in which an error has occurred, in such a manner.

In another embodiment, the error detector 1246 may determine whether the detected error is correctable, and may provide the transaction logger 1244 with an error detection result and information on whether the error is correctable. In this case, the transaction logger 1244 may maintain only information on an HMB address in which an uncorrectable error is detected, and may release information on the remaining HMB addresses.

For example, in FIG. 4B, it is assumed that an error has occurred in the first read data R_Data1 and the third read data R_Data3, and an uncorrectable error has occurred in the third read data R_Data3.

In this case, the error detector 1246 may detect errors in the first read data R_Data1 and the third read data R_Data3 and may determine that an uncorrectable error has occurred in the third read data R_Data3. The error detector 1246 may notify the transaction logger 1244 that an uncorrectable error has occurred in the third read data R_Data3. The transaction logger 1244 may release HMB addresses, corresponding to the second read data R_Data2 and fourth read data R_Data4, in which no error has been detected, and an HMB address corresponding to the first read data R_Data1 in which a correctable error has been detected. The transaction logger 1244 may maintain the information on an HMB address corresponding to the third read data R_Data3 in which an uncorrectable error has been detected. In such a manner, HMB address information on the host memory buffer 1120, corresponding to read data in which an uncorrectable error has been detected, may be collected.

In some implementations, the error detector 1246 may transmit the error detection result and the decoded first to fourth read data R_Data1 to R_Data4 to the transaction controller 1242.

The transaction controller 1242 may transmit the first read data R_Data1, the second read data R_Data2, and the fourth read data R_Data4, in which no error has been detected, to the CPU 1241 based on the error detection result.

In another example, the error detector 1246 may provide the transaction controller 1242 with the error detection result and the information on whether the corresponding error is correctable. In this case, the transaction controller 1242 may transmit the second read data R_Data2 and the fourth read data R_Data4, in which no error has been detected, to the CPU 1241 and may transmit the first read data R_Data1, in which an error has been detected but corrected through an error correction block, to the CPU 1241. The error correction block may be disposed in the HMB controller 1243, but example implementations are not limited thereto and the error correction block may be disposed in the storage controller 1240 to be electrically connected to the HMB controller 1243.

In FIG. 4B, the transaction controller 1242 is illustrated as receiving the first read data R_Data1 to the fourth read data R_Data4 from the error detector 1246, but this is merely exemplary and example implementations are not limited thereto. As another example, the transaction controller 1242 may receive the first read data R_Data1 to the fourth read data R_Data4 from the host interface 1220, and may transmit the first read data R_Data1, the second read data R_Data2, and the fourth read data R_Data4, in which no error has been detected, to the CPU 1241 based on the error detection result received from the error detector 1246.

In FIG. 4B, the host memory buffer 1120 is illustrated as sequentially transmitting the first read data R_Data1 to fourth read data R_Data4 to the host interface 1220, but example implementations are not limited thereto. As another example, the read data may be transmitted to the host interface 1220 in an order different from the order illustrated in FIG. 4B. The transaction controller 1242 may match the read command transmitted to the host interface 1220 and the read data received from the host interface 1220 to each other and may provide a result of the matching to the CPU 1241.

As described above, the HMB controller 1243 may continuously transmit a plurality of transaction requests to the host memory buffer 1120, regardless of whether the host memory buffer 1120 makes a response. The continuous transmission can improve a speed of access of the storage device 1200 to the host memory buffer 1120. In addition, the HMB controller 1243 may record all HMB addresses corresponding to a plurality of transactions, detect an error in data corresponding to each of the plurality of transactions, and collect all pieces of location information on the HMB corresponding to the transaction in which the error has occurred. Accordingly, data in which an error has occurred may be recovered using the corresponding location information.

Figure 5:
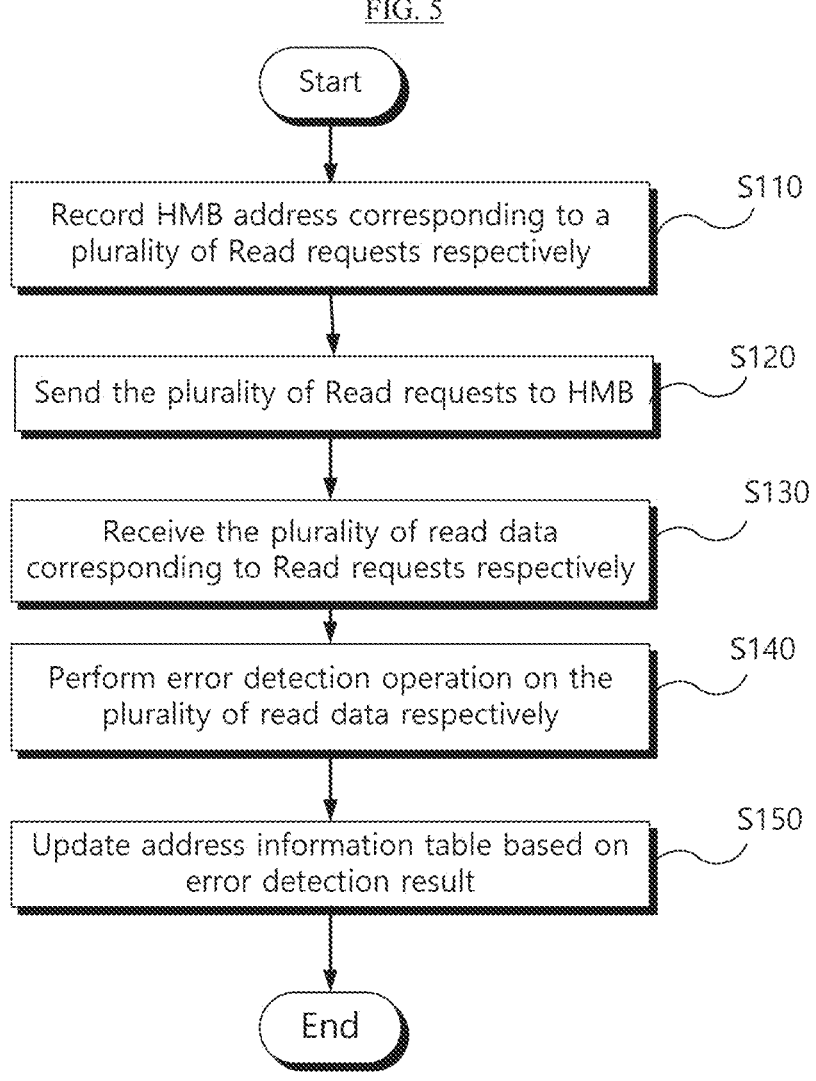
FIG. 5 is a flowchart illustrating an example of an operation of the storage device 1200 of FIG. 1.

FIG. 5 is a flowchart illustrating an example of an operation of the storage device 1200 of FIG. 1.

In operation S110, when the storage device 1200 needs to transmit a plurality of read requests to the host memory buffer 1120 to reference data stored in the host memory buffer 1120, the storage device 1200 records HMB addresses on the host memory buffer, respectively corresponding to a plurality of read requests. In some implementations, the storage device 1200 may match the HMB addresses on the host memory buffer 1120, targeted by each of the plurality of read requests, to the plurality of read requests and may record a result of the matching in the address information table.

In operation S120, the storage device 1200 transmits a plurality of read requests to the host memory buffer 1120. The storage device 1200 may sequentially transmit a plurality of read requests to the host memory buffer 1120 regardless of a response from the host memory buffer 1120. In some implementations, the storage device 1200 may substantially simultaneously transmit a plurality of read requests to the host memory buffer 1120 in parallel.

In operation S130, the storage device 1200 receives a plurality of pieces of read data corresponding to a plurality of read requests from the host memory buffer 1120.

In operation S140, the storage device 1200 performs an error detection operation on each of the plurality of pieces of read data.

In operation S150, the storage device 1200 updates the address information table based on the error detection result. For example, the storage device may update the address information table to maintain only an HMB address corresponding to read data requiring a data recovery operation.

In some implementations, when an error is detected in a portion of the plurality of pieces of read data, the storage device 1200 may release an HMB address corresponding to the read data, in which no error has been detected, and may maintain an HMB address corresponding to the read data in which an error has been detected.

In some implementations, the storage device 1200 may update the address information table based on the error detection result and whether the detected error is correctable. The storage device 1200 may release an HMB address corresponding to read data, in which no error has been detected, and an HMB address corresponding to read data, in which a correctable error has been detected, and may maintain an HMB address corresponding to read data in which an uncorrectable error is detected.

As described above, the storage device 1200 may transmit a plurality of transaction requests to the host memory buffer 1120 regardless of whether the host memory buffer 1120 makes a response, and may record information on the HMB addresses on the host memory buffer 1120, respectively corresponding to the plurality of transactions. Also, the storage device 1200 may collect HMB address information corresponding to a transaction in which an error has occurred, and the collected information may be used later in a data recovery operation for the HMB address.

Figure 6A:
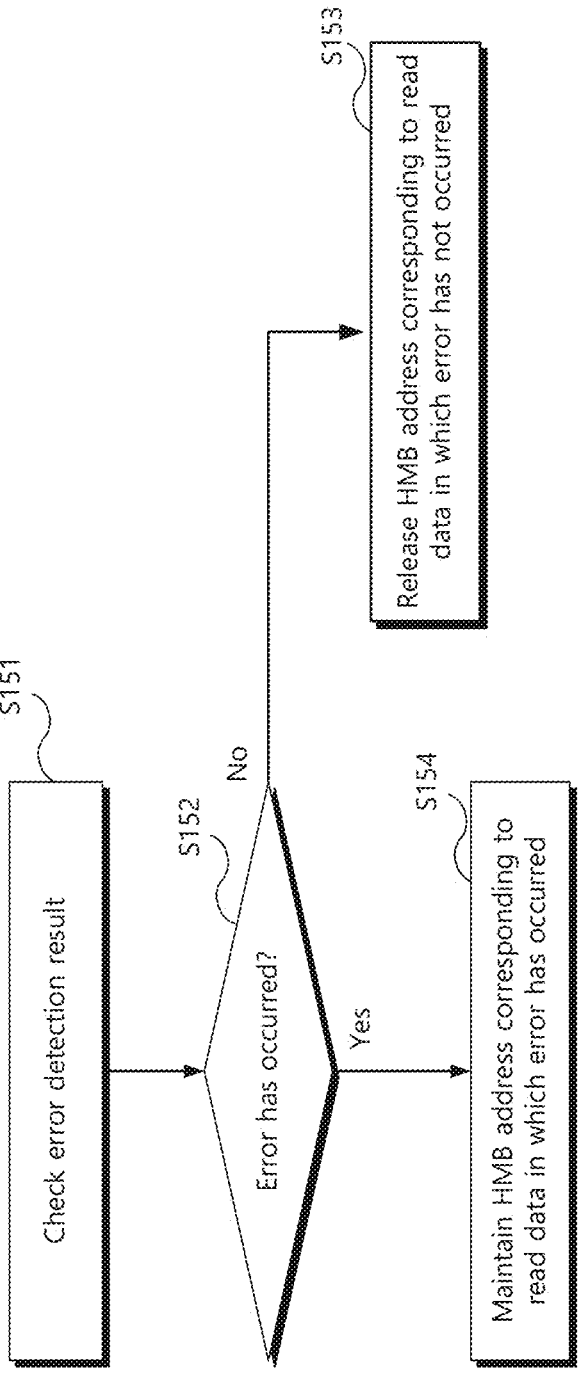
FIG. 6A is a flowchart illustrating an example of operation S150 of FIG. 5.

FIG. 6A is a flowchart illustrating an example of operation S150 of FIG. 5.

In operation S151, the storage device 1200 checks an error detection result of each read data.

In operation S152, the storage device 1200 checks whether an error has occurred in the corresponding read data.

When no error has occurred in the read data, the storage device 1200 releases an HMB address on the host memory buffer 1120, corresponding to the read data and, the read request in operation S153. In some implementations, the storage device 1200 may delete the HMB address on the host memory buffer 1120, corresponding to the read data, and the read request from the address information table.

Meanwhile, when an error has occurred in the read data, the storage device 1200 maintains the HMB address in the host memory buffer 1120, corresponding to the read data, and information, associated with the read request, in operation S154.

As described above, the storage device 1200 may collect an HMB address corresponding to read data, in which an error has been detected, among a plurality of pieces of read data received from the host memory buffer 1120.

FIG. 6B is a flowchart illustrating another example of operation S150 of FIG. 5.

In operation S151, the storage device 1200 checks an error detection result of each read data.

In operation S152, the storage device 1200 checks whether an error has occurred in the corresponding read data.

When no error has occurred in the read data, the storage device 1200 releases an HMB address on the host memory buffer 1120, corresponding to the corresponding data, and a read request in operation S155. In some implementations, the storage device 1200 may delete the HMB address on the host memory buffer 1120, corresponding to the data, and the read request from the address information table.

When an error has occurred in the read data, the storage device 1200 determines whether the read data is correctable, in operation S156. When the error is correctable by an error correction block, or the like, the storage device 1200 may release the HMB address on the host memory buffer 1120, corresponding to the read data, and read request in operation S155. When the occurred error is an uncorrectable error, the storage device 1200 may maintain information associated with the data, corresponding to the data in which an uncorrectable error has occurred, and the read request in operation S157.

As described above, the storage device 1200 may collect the HMB address, corresponding to uncorrectable read data, among a plurality of pieces of read data received from the host memory buffer 1120.

Figure 7:
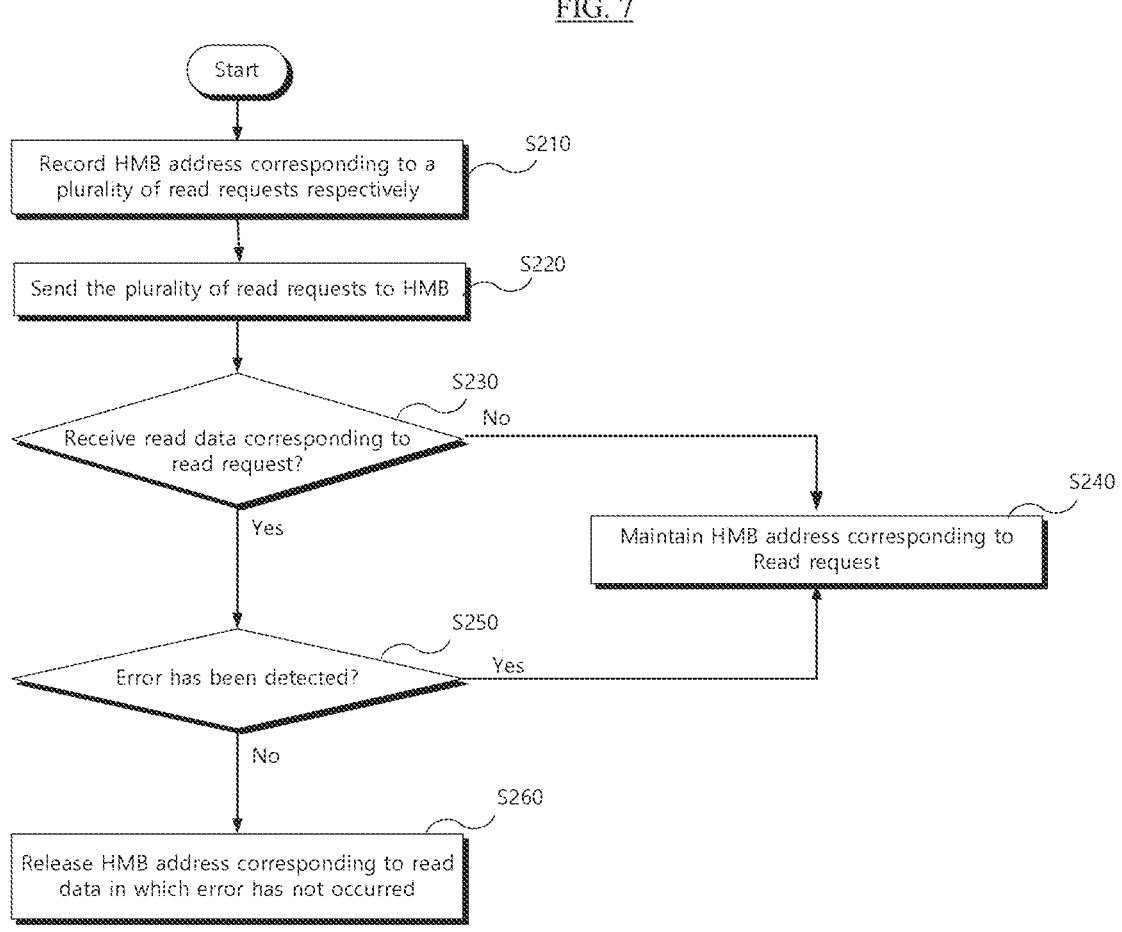
FIG. 7 is an example of a method of operating a storage device.

FIG. 7 is a diagram illustrating an example of a method of operating the storage device 1200.

In operation S210, when the storage device 1200 needs to transmit a plurality of read requests to the host memory buffer 1120 to reference data stored in the host memory buffer 1120, the storage device 1200 records HMB addresses on the host memory buffer 1120, respectively corresponding to the plurality of read requests.

In operation S220, the storage device 1200 transmits a plurality of read requests to the host memory buffer 1120 without delay.

In operation S230, the storage device 1200 checks whether a plurality of pieces of read data are received from the host memory buffer 1120, in response to a plurality of read requests. In some implementations, the storage device 1200 may check whether there is no response from the host memory buffer 1120 within a first time. It will be appreciated by a person of ordinary skill in the art that the first time may be set to vary depending on a communication environment between the storage device 1200 and the host 1100.

When read data is not received from the host memory buffer 1120 for the corresponding read request within the first time, the HMB address on the host memory buffer 1120 corresponding to the read data is stored, in operation S240. For example, link-down, PICe reset, NVMe reset, or the like, may prevent the storage device 1200 from receiving a response from the host memory buffer 1120. In this case, the HMB address on the host memory buffer 1120, corresponding to the read request, may be maintained to be processed in the same manner as if an error occurred in the corresponding read data.

In operation S250, the storage device 1200 checks whether an error is present in the plurality of pieces of read data. In some implementations, the storage device 1200 may perform an error detection operation on each of the plurality of pieces of read data.

When an error is detected in a portion of the plurality of pieces of read data, an HMB address corresponding to the read data, in which the error is detected, is stored in operation S240, and an HMB address corresponding to the read data, in which the error is not detected, is released in operation S260.

In another example, when an error is detected in a portion of the plurality of pieces of read data, an HMB address corresponding to read data, in which a correctable error is detected, may be released, and an HMB address corresponding to read data, in which an uncorrectable error is detected, may be maintained.

When no error is detected in all of the plurality of pieces of read data, all HMB addresses corresponding to the plurality of pieces of read data may be released and the address information table may be reset.

Figure 8B:
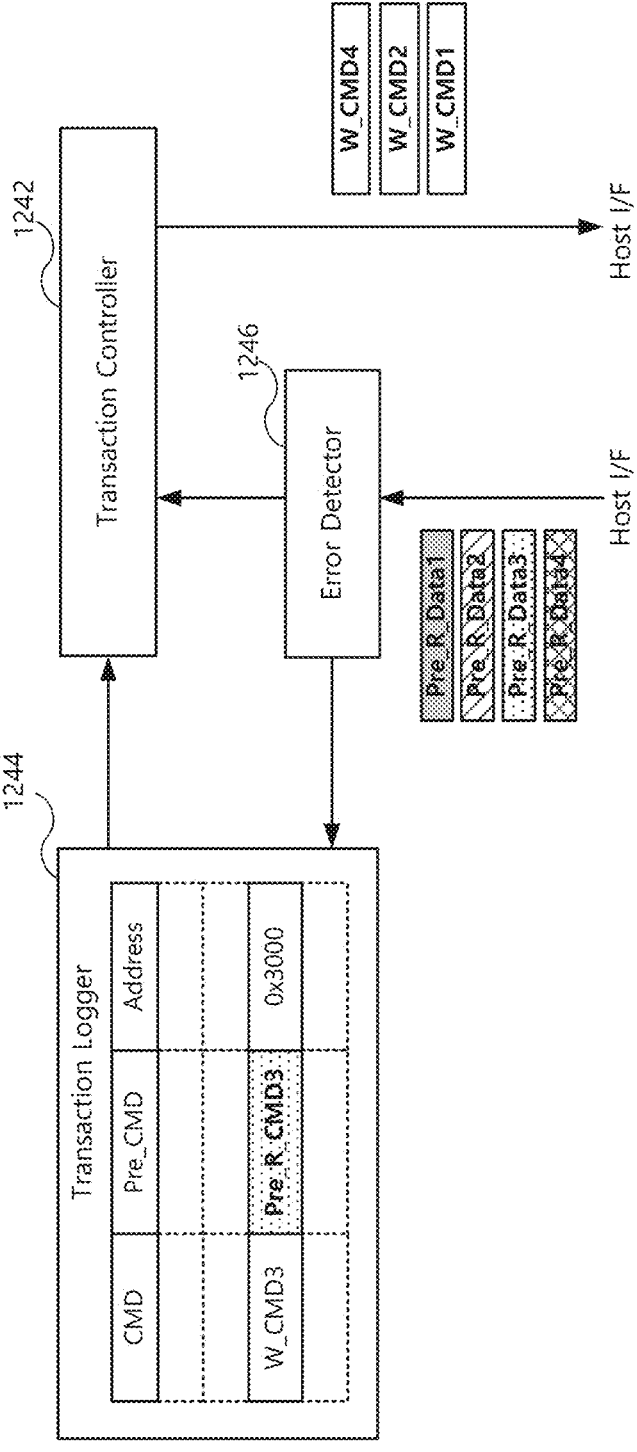
FIG. 8B is a diagram illustrating an example of an operation of an HMB controller when a plurality of pieces of preliminary read data are received from a host memory buffer.

FIGS. 8A and 8B are diagrams illustrating an example of an operation of the HMB controller 1243 of FIG. 2. For example, FIG. 8A illustrates an operation of the HMB controller 1243 transmitting a plurality of preliminary read requests, corresponding to a plurality of write requests, to the host memory buffer 1120, and FIG. 8B illustrates an operation of the HMB controller 1243 when receiving a plurality of pieces of preliminary read data.

Referring to FIG. 8A, when data needs to be written at first to fourth HMB addresses of the host memory buffer 1120, the CPU 1241 may transmit a first write request W_CMD1 to a fourth write request W_CMD4 to the transaction controller 1242.

The transaction controller 1242 may read data on an HMB address on the host memory buffer 1120 corresponding to a corresponding write request, rather than directly transmitting the first write request W_CMD1 to the fourth write request W_CMD4 to the host interface 1220.

For example, the transaction controller 1242 may generate a first preliminary read request Pre_R_CMD1 to a fourth preliminary read request Pre_R_CMD4 in response to the first write request W_CMD1 to the fourth write request W_CMD4, as illustrated in FIG. 8A. Then, the transaction controller 1242 may transmit the first preliminary read request Pre_R_CMD1 to the fourth preliminary read request Pre_R_CMD4 to the host interface 1220.

Also, the transaction controller 1242 may queue the first write request W_CMD1 to the fourth write request W_CMD4 through the transaction logger 1244, and may record an HMB address corresponding to each write request.

For example, the transaction controller 1242 may provide the transaction logger 1244 with information on the first write request W_CMD1 to the fourth write request W_CMD4. The transaction controller 1242 may provide the first preliminary read request Pre_R_CMD1 to the fourth preliminary read request Pre_R_CMD4, respectively corresponding to the first write request W_CMD1 to the fourth write request W_CMD4, together to the transaction controller 1242.

The transaction logger 1244 may map and record the first write request W_CMD1 to the fourth write request W_CMD4 together with a preliminary write request and an HMB address, respectively corresponding thereto.

For ease of description, it is assumed that the first HMB address is 0x1000, the second HMB address is 0x2000, the third HMB address is 0x3000, and the fourth HMB address is 0x4000. In this case, the transaction logger 1244 may map the first write request W_CMD1 to the first preliminary read request Pre_R_CMD1 and 0x1000, map the second write request W_CMD2 to the second preliminary read request Pre_R_CMD2 and 0x3000, map the third write request W_CMD3 to the third preliminary read request Pre_R_CMD3 and 0x3000, and map the fourth write request W_CMD4 the fourth preliminary read request Pre_R_CMD4 and 0x4000.

In FIG. 8A, the transaction controller 1242 is illustrated as transmitting the first preliminary read request Pre_R_CMD1 to the fourth preliminary read request Pre_R_CMD4 to the host interface 1220 upon generation thereof, but example implementations are not limited thereto. For example, the transaction controller 1242 may schedule the first preliminary read request Pre_R_CMD1 to the fourth preliminary read request Pre_R_CMD4 to be transmitted in parallel.

As described above, the HMB controller 1243 may first make a read request to a location to be written on the host memory buffer 1120 before making a write request to the host memory buffer 1120, and thus integrity of the location to be written may be checked to improve reliability of data.

Referring to FIG. 8B, the host memory buffer 1120 may receive a first preliminary read request Pre_R_CMD1 to a fourth preliminary read request Pre_R_CMD4, and may transmit first preliminary read data Pre_R_Data1 to fourth preliminary read data Read data Pre_R_Data4 to the host interface 1220 in response to the first preliminary read request Pre_R_CMD1 to the fourth preliminary read request Pre_R_CMD4.

The host interface 1220 may transmit the first preliminary read data Pre_R_Data1 to the fourth preliminary read data Pre_R_Data4 to the error detector 1246.

The error detector 1246 may perform an error detection operation on each of the first preliminary read data Pre_R_Data1 to the fourth preliminary read data Pre_R_Data4. The error detector 1246 may perform an error detection operation using checking data included in each of the first preliminary read data Pre_R_Data1 to the fourth preliminary read data Pre_R_Data4.

In some implementations, the checking data may include ECC parity and CRC parity and may be included in each of the first preliminary read data Pre_R_Data1 to the fourth preliminary read data Pre_R_Data4. The error detector 1246 may detect an error of each preliminary read data using the decoded ECC parity and the decoded CRC parity.

15

The error detector 1246 may transmit a result of the error detection to the transaction controller 1242 and the transaction logger 1244.

In some implementations, the error detector 1246 may determine whether the detected error is correctable by an error correction block, or the like. In this case, the error detector 1246 may generate information associated with the result of the error detection and whether the detected error is correctable.

The transaction controller 1242 may selectively transmit a write request corresponding to preliminary read data, in which no error has occurred, among a plurality of pieces of preliminary read data, to the host interface 1220 based on the result of the error detection of the error detector 1246.

In some implementations, the transaction controller 1242 may transmit a write request corresponding to preliminary read data, in which no error has occurred, and preliminary read data, in which a correctable error has occurred, among a plurality of pieces of preliminary read data, to the host interface 1220 based on the result of the error detection of the error detector 1246 and whether the detected error is correctable.

For ease of description, in FIG. 8B, it is assumed that an error is detected in the third preliminary read data Pre_R_Data3. In this case, the transaction controller 1242 may transmit a first write request W_CMD1, a second write request W_CMD2, and a fourth write request W_CMD4, respectively corresponding to first preliminary read data Pre_R_Data1, second preliminary read data Pre_R_Data2, and fourth preliminary read data Pre_R_Data4 in which no error has been detected, to the host interface 1220.

In this case, the transaction controller 1242 may check a write request for an HMB address, in which no error has occurred, based on a mapping relationship between a preliminary read request, the HMB address, and the write request on an address information table.

When transmitting the first write request W_CMD1, the second write request W_CMD2, and the fourth write request W_CMD4, the transaction controller 1242 may transmit checking data together. In some implementations, the checking data may include ECC parity and CRC parity, and encoded checking data may be included in each write request and transmitted.

Continuing to refer to FIG. 8B, the transaction logger 1244 may release HMB address information corresponding to first preliminary read data Pre_R_Data1, second preliminary read data Pre_R_Data2, and fourth read data Pre_R_Data4 in which no error has been detected. For example, the transaction logger 1244 may delete a first HMB address 0x1000, a second HMB address 0x2000, and a fourth HMB address 0x4000 from the address information table. In this case, the transaction logger 1244 may also delete information on the first preliminary read request Pre_R_CMD1, the second preliminary read request Pre_R_CMD2, and the fourth preliminary read request Pre_R_CMD2, respectively mapped to the first HMB address 0x1000, the second HMB address 0x2000, and the fourth HMB address 0x4000, and the first write request W_CMD1, the second write request W_CMD2, and the fourth write request W_CMD4.

The transaction logger 1244 may maintain a third preliminary read request Pre_R_CMD3 corresponding to the third preliminary read data Pre_R_Data3, in which an error has been detected, and information on the third HMB address 0x3000. The transaction logger 1244 may collect HMB address information on an HMB, corresponding to preliminary read data in which an error has been occurred, in such a manner.

In some implementations, the transaction logger 1244 may release HMB address information corresponding to preliminary read data, in which no error has occurred, and preliminary read data, in which a correctable error has occurred, among a plurality of pieces of preliminary read data and maintain HMB address corresponding to preliminary read data in which an uncorrectable error has occurred, based on an error correction result and whether a detected error is correctable.

As described above, the HMB controller 1243 may transmit a preliminary read request to a location to be written on the host memory buffer 1120 before making a write request to the host memory buffer 1120. Then, the HMB controller 1243 may transmit only a write request corresponding to preliminary read data, corresponding to a preliminary read request, in which no error is present, or preliminary read data in which a correctable error has occurred. In addition, the HMB controller 1243 may collect HMB address information corresponding to preliminary read data in which an error has occurred. Accordingly, when data is written in the host memory buffer 1120, reliability of data may be improved.

Figure 9:
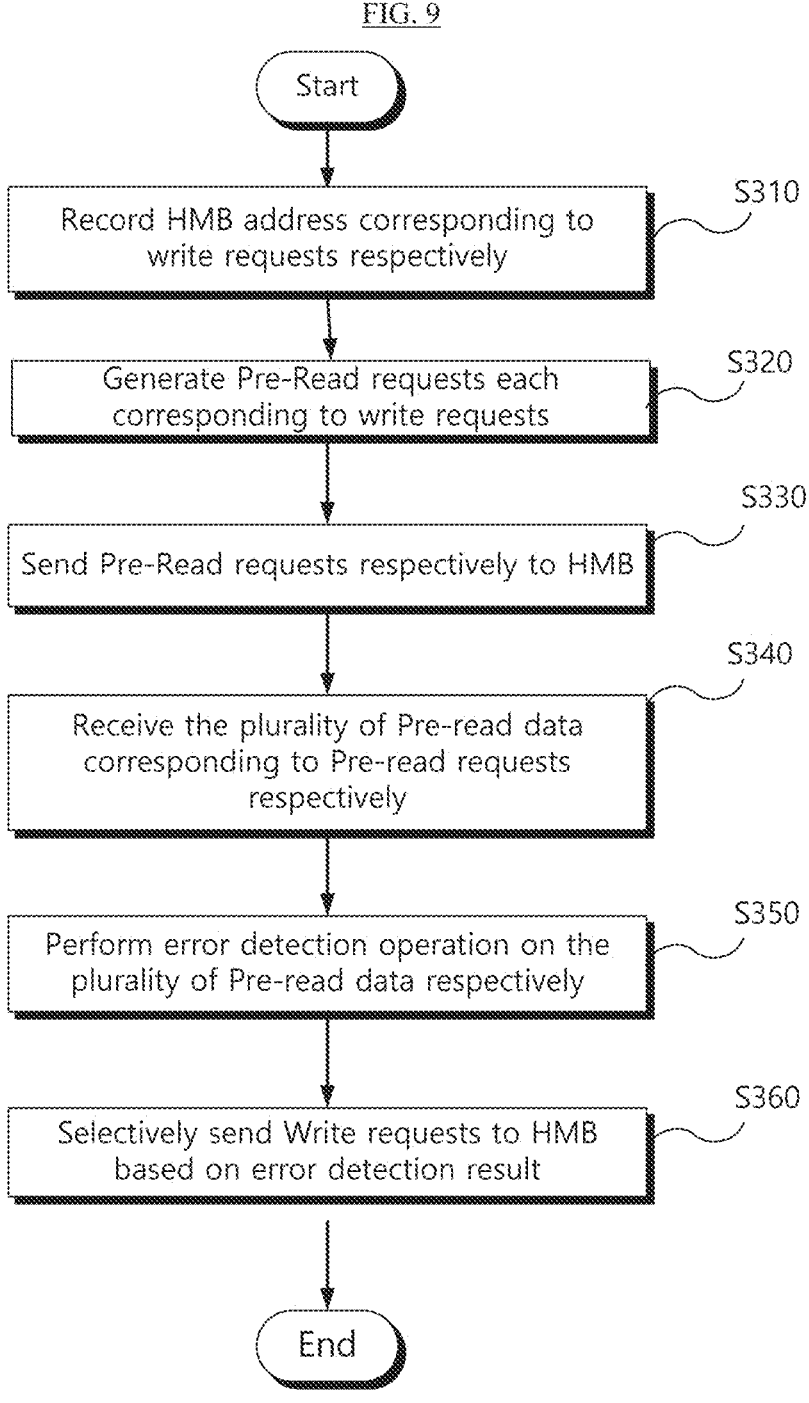
FIG. 9 is a flowchart illustrating an example of an operation of the storage device of FIG. 1.

FIG. 9 is a flowchart illustrating an example of an operation of the storage device 1200 of FIG. 1.

In operation S310, when the storage device 1200 needs to transmit a plurality of write requests to the host memory buffer 1120 to write data in the host memory buffer 1120, the storage device 1200 writes an HMB address on the host memory buffer 1120, corresponding to each of the plurality of write requests.

In operation S320, the storage device 1200 generates a plurality of preliminary read requests, respectively corresponding to the plurality of write requests. Each of the plurality of preliminary read requests may be a request for reading data stored in a destination address of a plurality of write requests corresponding thereto.

In operation S330, the storage device 1200 transmits a plurality of preliminary read requests to the host memory buffer 1120. In some implementations, the storage device 1200 may continuously transmit the plurality of preliminary read requests regardless of a response of the host memory buffer. In another example, the storage device 1200 may transmit the plurality of preliminary read requests in parallel.

In operation S340, the storage device 1200 receives a plurality of pieces of preliminary read data, respectively corresponding to the plurality of preliminary read requests, from the host memory buffer 1120.

In operation S350, the storage device 1200 performs an error detection operation on each of the plurality of pieces of preliminary read data.

In operation S360, the storage device 1200 transmits a portion of the plurality of write requests to the host memory buffer 1120 based on the error detection result. In some implementations, the storage device 1200 transmits only a write request, corresponding to preliminary read data in which no error has occurred, among the plurality of write requests, to the host interface 1220.

In another example, the storage device 1200 may transmit a portion of the plurality of write requests to the host memory buffer 1120, depending on an error detection result and whether the detected error is correctable. For example, the storage device 1200 may transmit only a write request, corresponding to preliminary read data in which no error has occurred or a correctable error has occurred, among a plurality of write requests, to the host interface 1220.

As described above, the storage device 1200 may transmit a preliminary read request to an HMB address, a destination of a write request, before transmitting the write request to the host memory buffer 1120 and may transmit a write request only when no error is detected or a correctable error is detected in preliminary read data for the preliminary read request. Accordingly, when the storage device 1200 has a write accesses to the host memory buffer 1120, reliability of data may be further improved.

Figure 10:
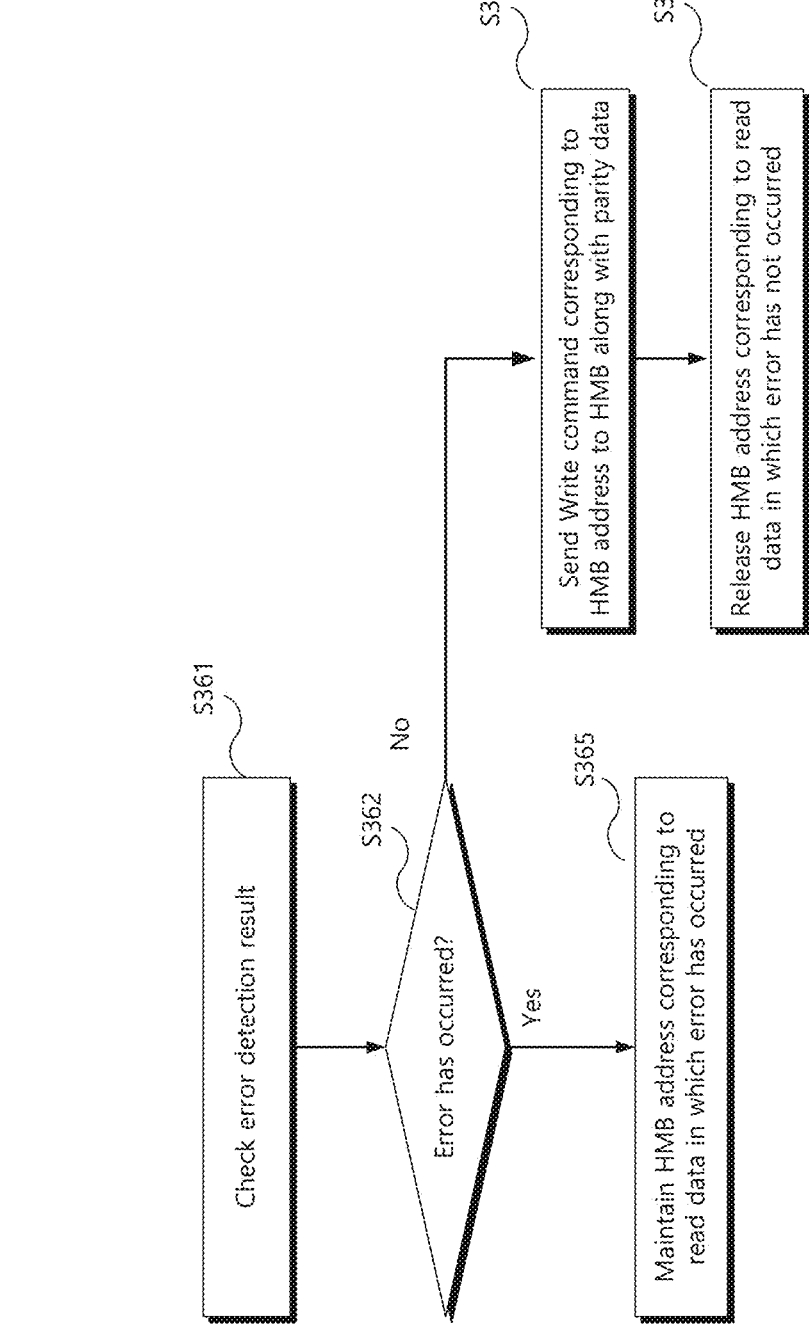
FIG. 10 is a flowchart illustrating an example of operation S360 of FIG. 9.

FIG. 10 is a flowchart illustrating an example of operation S360 of FIG. 9.

In operation S361, the storage device 1200 checks an error detection result for each of a plurality of pieces of preliminary read data.

In operation S362, the storage device 1200 identifies whether an error has occurred in a corresponding preliminary read data.

When no error has occurred in the corresponding preliminary read data, the storage device 1200 transmits a write request corresponding to the corresponding preliminary read data to the host memory buffer 1120 in operation S363. In some implementations, when a detected error is correctable, the storage device 1200 also transmits the write request corresponding to the corresponding preliminary read data to the host memory buffer 1120.

In operation S364, the storage device 1200 releases an HMB address on the host memory buffer 1120, corresponding to preliminary read data in which no error has occurred. In some implementations, the storage device 1200 deletes an HMB address corresponding to the corresponding preliminary read data, a preliminary read request, and write request information together.

When an error has occurred in the corresponding preliminary read data, the storage device 1200 maintains HMB address information, corresponding to the preliminary read data in which an error has occurred, and write request information in operation S365. The storage device 1200 may transmit a write request, corresponding to the corresponding preliminary read data, to the host memory buffer 1120 after recovering the preliminary read data in which an error has occurred, rather than directly transmitting the write request to the host memory buffer 1120.

In some implementations, the storage device 1200 may release preliminary read data, in which no error has occurred, and preliminary read data, in which a correctable error has occurred, among a plurality of pieces of preliminary read data, and may maintain HMB address information corresponding to preliminary read data in which an uncorrectable error has occurred. The storage device 1200 may transmit a write request, corresponding to the preliminary read data in which an uncorrectable error has occurred, to the host memory buffer 1120 after recovering the preliminary read data, rather than directly transmitting the write request to the host memory buffer 1120.

Figure 11:
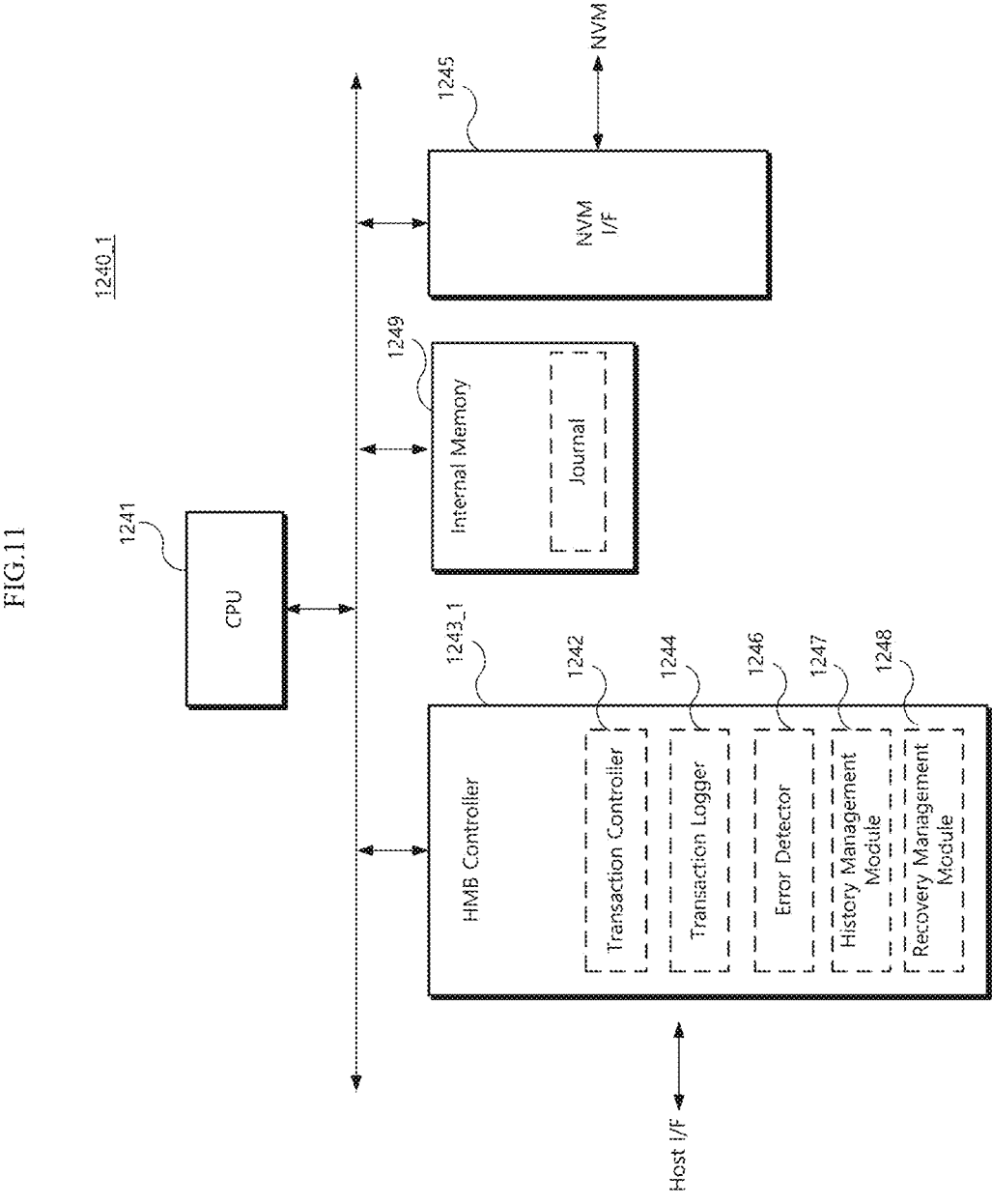
FIG. 11 is a diagram illustrating an example of a storage controller.

FIG. 11 is a diagram illustrating an example of a storage controller 1240_1. The storage controller 1240_1 of FIG. 11 is similar to the storage controller 1240 of FIG. 2. Accordingly, same or similar elements are denoted by same or similar reference numerals, and redundant descriptions will be omitted below.

The storage controller 1240_1 of FIG. 11 includes an HMB controller 1243_1. Unlike the HMB controller 1243 of FIG. 2, the HMB controller 1243_1 further includes a history management module 1247 and a recovery management module 1248.

The history management module 1247 may record a history of accesses of the storage device 1200 to the host memory buffer 1120, and may manage a data synchronization operation between the nonvolatile memory device 1260 and the host memory buffer 1120.

The recovery management module 1248 may manage a data recovery operation for an HMB address, at which data damage has occurred, based on history information of the history management module 1247.

As described with reference to FIG. 2, when power is supplied to the storage system 1000A, the storage controller 1240_1 may load required data, among a plurality of pieces of data stored in the nonvolatile memory device 1260, into the host memory buffer 1120. The host memory buffer 1120 may store mapping data for address mapping of the nonvolatile memory device 1260 and management data for management or control of the storage device 1200, and may temporarily store user data to be written in the storage device 1200.

Data stored in the host memory buffer 1120 may be updated. For example, when the host 1100 writes user data to the nonvolatile memory device 1260, mapping data, or the like, may be updated. Such an update may cause a difference between the mapping data, stored in the nonvolatile memory device 1260, and the mapping data stored in the host memory buffer 1120. Accordingly, the storage system 1000A may periodically flush data, stored in the host memory buffer 1120, to the nonvolatile memory device 1260 to synchronize data of the nonvolatile memory device 1260 and data of the host memory buffer 1120 with each other.

The history management module 1247 may control the storage controller 1240_1 to periodically perform such a flush operation.

When the mapping data stored in the host memory buffer 1120 and the mapping data stored in the nonvolatile memory device 1260 are matched with each other by a flush operation, or the like, the data may be regarded as "clean" data. On the other hand, when the mapping data stored in the host memory buffer 1120 and the mapping data stored in the nonvolatile memory device 1260 are not matched with each other by an update operation, or the like, the data may be regarded as "dirty" data.

In some implementations, the recovery management module 1248 may determine whether data stored in an error HMB address has been updated.

When data of an HMB address, at which an error has occurred, was not updated after being loaded into the host memory buffer 1120 or was not updated after a latest flush operation, the recovery management module 1248 may fetch clean data from the nonvolatile memory device 1260 and load the fetched data into the HMB address on the host memory buffer 1120. The term "latest flush operation" may refer to a flush operation, temporally closest to a time point at which a determination is made as to whether the data has been updated.

Meanwhile, when the data of the HMB address, at which an error has occurred, is dirty, the recovery management module 1248 may recover the data of the HMB address, at which the error has occurred, using a journal for the HMB address at which the error has occurred.

For example, when the data of the HMB address, at which an error occurred, has been updated after a latest flush operation or was first loaded into the host memory buffer 1120 and then updated but a flush operation was not performed, the recovery management module 1248 may recover the data of the HMB address, at which an error has occurred, using a journal for the HMB address at which an error has occurred.

The journal may be history information on update items of the data stored in the HMB address. The journal may be generated in response to an update operation of data stored in the host memory buffer 1120. The journal may include a plurality of pieces of journal data, and each of the plurality of pieces of journal data may include an address and data written in a corresponding address, thereby perceiving which data was written to which address through the journal data.

In some implementations, the history management module 1247 may generate journal data in response to an update operation of data stored in the HMB address. The journal data may be stored in the internal memory 1249. However, example implementations are not limited thereto, and the journal may be stored in the nonvolatile memory device 1260 depending on a size of the journal data or a design of the storage system 1000A.

The recovery management module 1248 may replay a write access from the latest flush operation to a time point, at which data damage was recognized, using such a journal to perform a data recovery operation on a location of the host memory buffer 1120 in which an error has occurred.

In some implementations, the HMB controller 1243_1 may retransmit a read request for a location, in which the recovery was completed, on the host memory buffer 1120 after the data recovery operation is completed. The HMB controller 1243_1 may determine whether or not to continue to use the location, in which the recovery was completed, on the host memory buffer 1120 based on whether an error has occurred in the data for the read request.

For example, the recovery management module 1248 may notify the transaction controller 1242 of the completion of the data recovery operation after the data recovery operation was completed. The transaction controller 1242 may transmit a re-read request for the recovered HMB address to the host memory buffer 1120 through the host interface 1220. In some implementations, the transaction controller 1242 may transmit a plurality of re-read requests. In this case, the transaction logger 1244 may record the HMB addresses corresponding to the plurality of re-read requests.

The host memory buffer 1120 may transmit re-read data to the host interface 1220 in response to the re-read request.

The error detector 1246 may receive the re-read data through the host interface 1220, and may detect whether an error has occurred in the re-read request data.

When no error is detected in the re-read data, data stored in the corresponding HMB address may be reused by the storage controller 1240_1.

Meanwhile, when an error is detected in the re-read data, the recovery management module 1248 may mark the corresponding HMB address as a bad region and may prevent data from being stored in a corresponding location. Accordingly, recovery overhead caused by repeated occurrence of errors may be prevented.

In some implementations, the recovery management module 1248 may remap the corresponding HMB address to a different HMB address in the host memory buffer 1120. In some implementations, data of an HMB address, at which an error has occurred again, may be loaded into the remapped HMB address and used, but example implementations are not limited thereto. For example, the data of the HMB address, at which an error has occurred again, may be loaded into the internal memory 1249 and used.

As described above, the HMB controller 1243_1 may collect all locations of HMB addresses, at which errors has occurred, to perform a data recovery operation on the corresponding locations.

The HMB controller 1243_1 may only collect a location of an HMB address, at which an uncorrectable error has occurred, to perform a data recovery operation on a corresponding location.

Also, the HMB controller 1243_1 may determine whether the data of the HMB address at which an error occurred has been updated. When the data of the HMB address at which an error occurred has been updated, the HMB controller 1243_1 may recover data using the journal data.

In addition, a read access to the HMB address, at which the recovery was completed, may be performed again after completion of the recovery operation. When an error occurs, a corresponding region on the host memory buffer 1120 may be marked as a bad region to prevent data from being stored in a corresponding location. Accordingly, a speed of access to the host memory buffer 1120 may be improved, and a recovery operation may be performed on all pieces of data, in which an error has occurred, to improve reliability of data and increase efficiency of the recovery operation.

Figure 12:
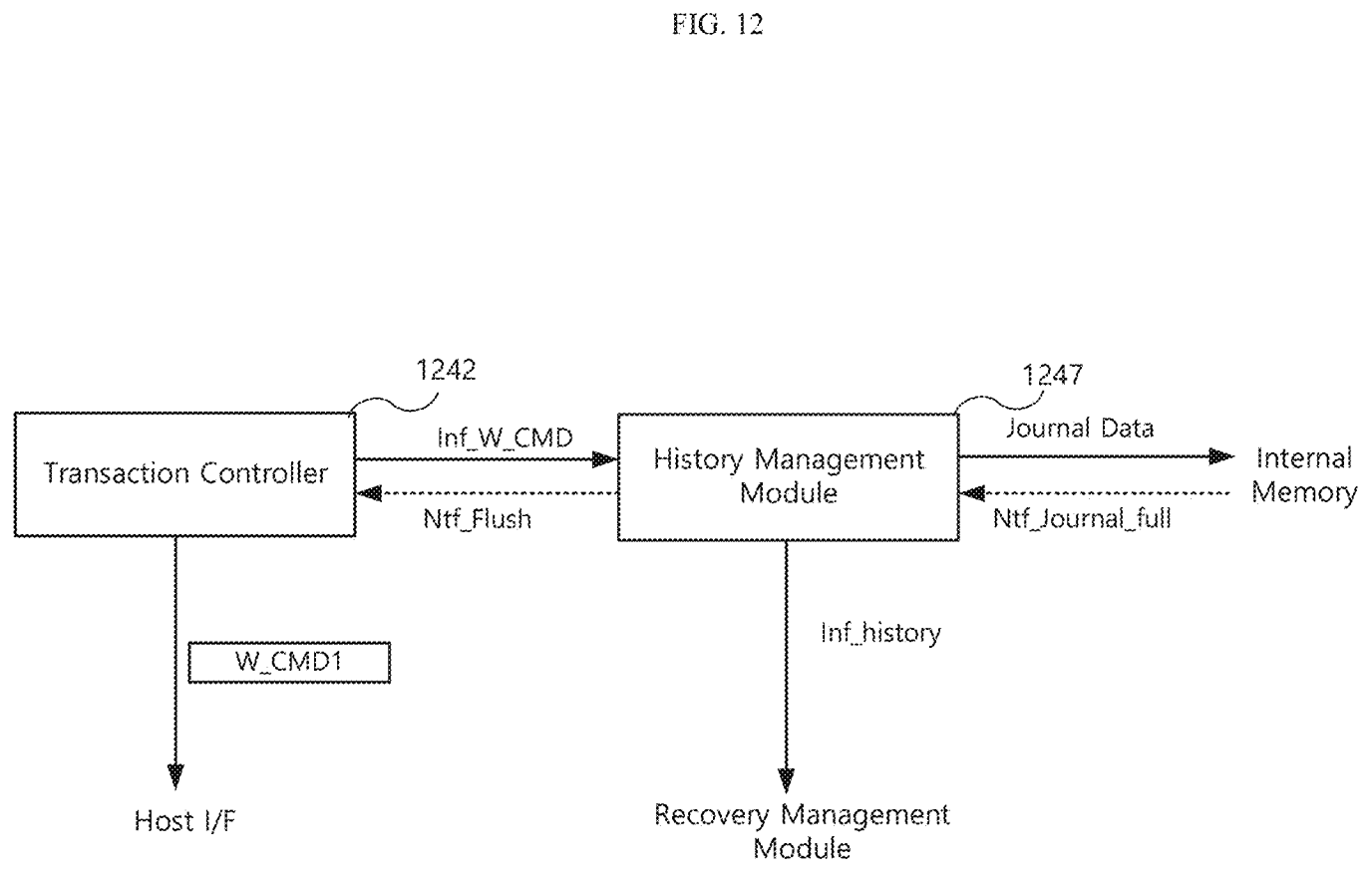

FIG. 12 is a diagram illustrating an example of an operation of the HMB controller 1243_1 of FIG. 11. For ease of description, it is assumed that the storage controller 1240_1 transmits a write request to the host memory buffer 1120.

Referring to FIG. 12, the transaction controller 1242 may transmit a first write request W_CMD1 to the host interface 1220. In some implementations, when it is identified that no error is present in data stored in a destination HMB address of the first write request W_CMD1, the transaction controller 1242 may transmit the first write request W_CMD1.

The transaction controller 1242 may transmit information Inf_W_CMD on a write request to the history management module 1247. The information Inf_W_CMD on the write request may include an HMB address on the host memory buffer 1120, corresponding to the write request, and data.

The history management module 1247 may generate journal data based on the information Inf_W_CMD on the write request.

In some implementations, the history management module 1247 may determine whether update has occurred in the data stored in the HMB address on the host memory buffer 1120 corresponding to the write request. When update has occurred at the corresponding HMB address, journal data may be generated. In the example of FIG. 12, the journal data may include an HMB address on the host memory buffer 1120, corresponding to the first write request W_CMD1, and data.

The history management module 14247 may store the generated journal data in the internal memory 1249. A plurality of pieces of journal data, stored in such a manner, may constitute the journal of FIG. 11.

In some implementations, spaces allocated to the journal may all be used due to the plurality of pieces of journal data generated in response to an update operation of the data stored in the HMB address. In this case, the internal memory 1249 may transmit notification Ntf_Journal_full that the journal is full to the history management module 1247.

The history management module 1247 may determine whether a flush operation is required, based on the notification Ntf_Journal_full that the journal is full. The history management module 1247 may transmit Ntf_Flush that the flush operation is required to the transaction controller 1242. The transaction controller 1242 may generate an instruction to perform the flush operation. As described above, a determination may be made as to whether the flush operation is required, based on whether capacity allocated to the journal is full, and data synchronization between the nonvolatile memory device 1260 and the host memory buffer 1120 may be performed by the flush operation.

In some implementations, the history management module 1247 may generate history information Inf_history. The history information Inf_history may include information on history in which a flush operation has been performed. In some implementations, the history information Inf_history may include write access information on an HMB address, in addition to the information on history in which the flush operation has been performed.

Then, the recovery management module 1248 may perform a data recovery operation based on the history information Inf_history.

As described above, the HMB controller 1243_1 of FIG. 11 may record information on an access to the host memory buffer 1120 and history information on data synchronization between the nonvolatile memory device 1260 and the host memory buffer 1120, and may perform a data recovery operation based on the recorded information and the recorded history information.

Figures 13, 14:
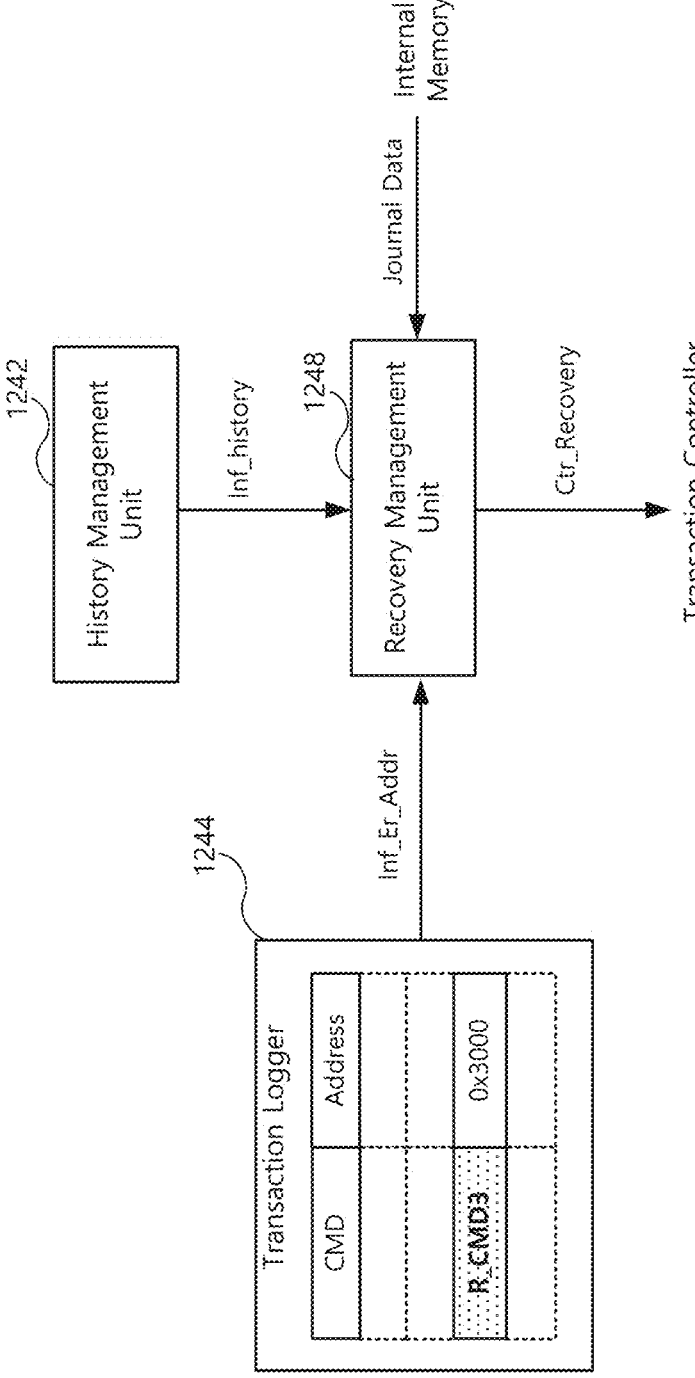
FIG. 13 is a diagram illustrating an example of an operation of the HMB controller of FIG. 11.
FIG. 14 is a flowchart illustrating an example of an operation of the storage controller of FIG. 11.
Figure 14:
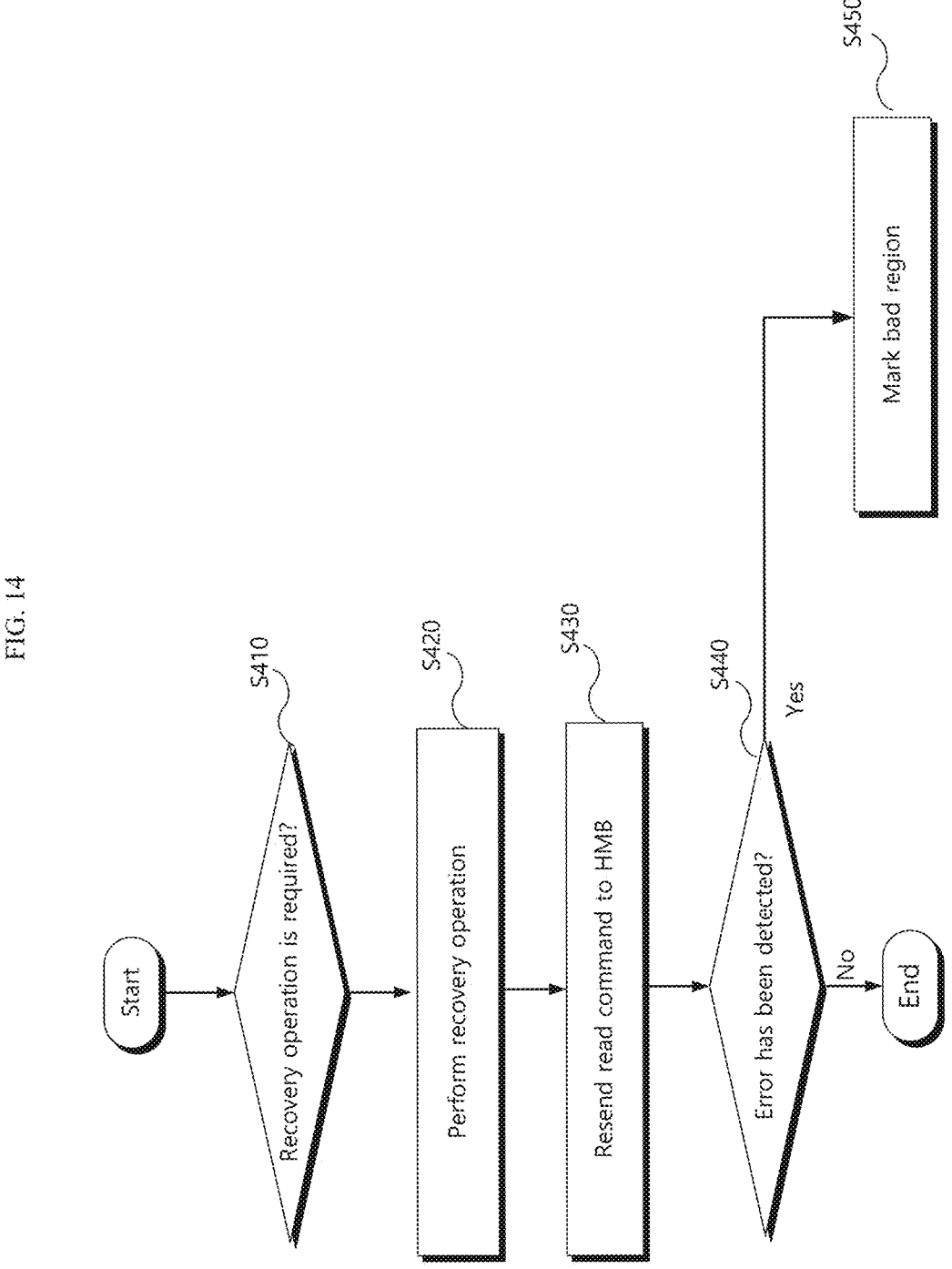

FIG. 13 is a diagram illustrating an example of an operation of the HMB controller 1243_1 of FIG. 11. For ease of description, it is assumed that an error occurs at an HMB address 0x3000 corresponding to the third read request R_CMD3.

The recovery management module 1248 may perform a recovery operation based on an HMB address at which an error has occurred. In some implementations, the recovery management module 1248 may receive location information Inf_Er_Addr on the host memory buffer, at which an error has occurred, from the transaction logger 1244.

Referring to FIG. 13, the recovery management module 1248 may perceive whether an error has occurred at the HMB address 0x3000, based on the location information Inf_Er_Addr on the host memory buffer 1120 at which the error has occurred.

The recovery management module 1248 may determine whether data stored in the HMB address, at which the error has occurred, has been updated. In some implementations, the history management module 1247 may determine whether the data stored in the HMB address, at which the error has occurred, has been updated, based on the history information Inf_history received from the history management module 1247.

In some implementations, the history information Inf_history may include information on history in which a flush operation has been performed, and the recovery management module 1248 may determine whether update was performed, by referencing the journal data together. In some implementations, the history information Inf_history may include write access information on the HMB address in addition to information on history in which a flush operation has been performed, and the recovery management module 1248 may determine whether update was performed, based on the history information Inf_history.

The recovery management module 1248 may determine whether data of the HMB address 0x3000, corresponding to the third read request R_CMD3, has been updated from the history information Inf_history.

When the data of the HMB address 0x3000 was not updated after being loaded into the host memory buffer 1120 or was not updated after a latest flush operation, the recovery management module 1248 may generate a recovery control signal Ctr_Recovery to fetch clean data from the nonvolatile memory device 1260 and load the clean data into the HMB address 0x3000.

Alternatively, when the data of the HMB address 0x3000 has been updated after a latest flush operation or when a flush operation was not performed after the data of the HMB address 0x3000 was loaded into the host memory buffer 1120 and then updated, the recovery management module 1248 may generate a recovery control signal Ctr_Recovery to recover the data of the HMB address, at which the error has occurred, using journal data on the HMB address 0x3000.

In some implementations, the recovery management module 1248 may generate a recovery control signal Ctr_Recovery to replay a write access from a most recent flush operation to a time point, at which data damage was recognized, based on the journal data stored in the internal memory 1249.

In some implementations, the recovery control signal Ctr_Recovery may be transmitted to the transaction controller 1242. The transaction controller 1242 may generate an instruction to perform a recovery operation based on the recovery control signal Ctr_Recovery. For example, an instruction to load data from the nonvolatile memory device 1260 may be transmitted to the CPU 1241, or an access request to reload the loaded data into the host memory buffer 1120 may be transmitted to the host interface 1220.

As described above, the history management module 1247 may enable a recovery operation to be performed on all locations on the host memory buffer 1120 in which errors have occurred, and may allow a recovery operation to be performed based on whether a corresponding location has been updated and journal data, resulting in increased accuracy of the recovery operation.

FIG. 14 is a flowchart illustrating an example of an operation of the storage controller 1240_1 of FIG. 11.

In operation S410, the storage controller 1240_1 determines whether a data recovery operation is required. In some implementations, the storage controller 1240_1 may identify an HMB address, at which an error has occurred, as an HMB address requiring a data recovery operation. In another embodiment, only an HMB address, at which an uncorrectable error has occurred, may be identified as an HMB address requiring a data recovery operation.

For example, the storage controller 1240_1 may check whether a data recovery operation is required, a target of the recovery operation based on a collected HMB address at which an error has occurred, and information associated with whether the error is recoverable.

In operation S420, the storage controller 1240_1 performs a data recovery operation of the HMB address determined to require a recovery operation. In some implementations, the storage controller 1240_1 may determine whether data of an HMB address of a recovery target has been updated after a latest flush operation, or whether a flush operation was not performed after data of an HMB address of a recovery target was loaded into the host memory buffer 1120 and then updated. When the data was not updated, clean data may be fetched from the nonvolatile memory device 1260 and then loaded into a corresponding HMB address on the host memory buffer 1120. Meanwhile, when the data has been updated, a data recovery operation may be performed in a location of the host memory buffer 1120 in which an error has occurred, based on journal data.

In operation S430, the storage controller 1240_1 transmits a read request to the corresponding HMB address of the host memory buffer 1120 which has been restored. The read request may be referred to as a "re-read request" because the read request is a request to read data again in a location in which a recovery operation has been completed.

In operation S440, the storage controller 1240_1 detects whether an error has occurred in the read data received from the host memory buffer 1120 in response to the re-read request. The read data may be referred to as "re-read data" because the read data is data read through the re-read request. In some implementations, the storage controller 1240_1 may determine whether an error has occurred, using checking test data included in the re-read data. In some implementations, the checking data may be ECC parity and CRC parity and may be included in the re-read data. The storage controller 1240_1 may detect an error in re-read data using decoded ECC parity and decoded CRC parity.

When an error occurs in the re-read data, the storage controller 1240_1 marks a corresponding HMB address as a bad region and may prevent data from being stored in a corresponding location, in operation S450. In some implementations, the storage controller 1240_1 may remap the corresponding HMB address to a different HMB address in the host memory buffer 1120.

Meanwhile, when no error is detected in the re-read data, the corresponding HMB address may be determined to be still usable. Accordingly, the data stored in the corresponding HMB address may be reused by the storage controller 1240_1, and then a request for normal access to the corresponding location may be performed.

In some implementations, even when an error detected in the re-read data is correctable, the HMB address may be determined to be still usable. In this case, the corresponding HMB address may be marked as a bad region only when an uncorrectable error is detected in the re-read data.

As described above, the storage controller 1240_1 may determine whether data of an HMB address to be recovered has been updated. When the data of the HMB address to be recovered has been updated, the data may be journal data may be used to recover data. In addition, when an error is caused by giving a read access again to the HMB address, in which recovery was completed, after completion of a recovery operation, a corresponding area on the host memory buffer 1120 may be marked as a bad region and data may be prevented from being stored in the bad region. Accordingly, a speed of access to the host memory buffer 1120 may be improved, and by performing a recovery operation on all pieces of data in which errors have occurred, reliability of data may be improved and efficiency of the recovery operation may be increased.

FIG. 15 is a flowchart illustrating an example of operation S420 of FIG. 14.

In operation S421, the storage controller 1240_1 determines whether data of an HMB address to be restored, for example, an HMB address at which an error occurred, has been updated after a latest flush operation (hereinafter, Case 1). Alternatively, the storage controller 1240_1 may determine whether the data of the HMB address has been updated after being first loaded into the host memory buffer 1120, but a flush operation has not yet been performed (hereinafter, Case 2).

When neither Case 1 or Case 2 is applicable, the storage controller 1240_1 fetches clean data from the nonvolatile memory device 1260 and load the clean data into a corresponding HMB address on the host memory buffer 1120 in operation S422.

Alternatively, when one of Cases 1 and 2 is applicable, data of an HMB address at which with an error has occurred is recovered using journal data for the HMB address at which an error has occurred. In this case, the storage controller 1240_1 replays a write access from a most recent flush operation to a time point at which data damage was recognized or a time point of data recovery operation according to journal data to recover data of the HMB address at which an error has occurred in operation S423.

As described above, the storage controller 1240_1 may determine whether data of an HMB address at which an error occurred has been updated. When the data of the HMB address, at which an error occurred, has been updated, the data may be recovered using journal data. Accordingly, accurately of data recovery may be increased to improve reliability of data when having an access to the host memory buffer 1120.

As set forth above, according to example implementations, a storage device may secure reliability of data while preventing performance degradation caused by a latency during an access of the storage device to a host memory buffer.

While example implementations have been shown and described above, it will be apparent to those skilled in the art that modifications and variations could be made without departing from the scope of the present inventive concept as defined by the appended claims.

What is claimed is:

1. A method of operating a storage device using a host memory buffer of a host, the method comprising:

based on a plurality of read requests for the host memory buffer being required, recording, in an address information table, information on host memory buffer (HMB) addresses on the host memory buffer, the HMB addresses respectively corresponding to the plurality of read requests for the host memory buffer;

transmitting a first read request of the plurality of read requests to the host memory buffer;

before receiving a response from the host memory buffer based on the first read request, transmitting a second read request of the plurality of read requests to the host memory buffer;

receiving a plurality of pieces of read data from the host memory buffer, the plurality of pieces of read data respectively corresponding to the first and second read requests of the plurality of read requests;

detecting one or more errors within the plurality of pieces of read data; and updating the address information table based on a result of the detection of one or more errors.

2. The method of claim 1, wherein updating the address information table comprises:

releasing HMB address information, corresponding to read data in which no error was detected, of the information on the HMB addresses on the host memory buffer; and maintaining HMB address information corresponding to read data in which an error was detected.

3. The method of claim 2, wherein the plurality of read requests comprises the first read request to an $n^{th}$ read request, wherein n is an integer greater than 1, and wherein, in transmitting the plurality of read request to the host memory buffer, the storage device is configured to transmit the $n^{th}$ read request to the host memory buffer regardless of a response by the host memory buffer to an $n-1^{th}$ read request, and the method comprising:

performing a data recovery operation on the maintained HMB address information in the updated address information table.

4. The method of claim 3, wherein performing the data recovery operation comprises:

determining whether data of an HMB address corresponding to a target of the data recovery operation has been updated after a latest flush operation.

5. The method of claim 4, wherein performing the data recovery operation comprises:

loading clean data from a nonvolatile memory device in the storage device; and based on the data of the HMB address corresponding to a target of the data recovery operation having not been updated, writing the loaded clean data in an HMB address corresponding to the read data in which the error was detected.

6. The method of claim 5, wherein performing the data recovery operation comprises:

based on data of the HMB address corresponding to the target of the data recovery operation has been updated, replaying a write access to the host memory buffer from the latest flush operation to a time point at which an error was detected, based on journal data on the HMB address, and wherein the journal data comprises information associated with an address and data of a write request performed on the HMB address.

7. The method of claim 3, further comprising:

after completion of the data recovery operation, transmitting, to the host memory buffer, a re-read request for each of HMB addresses on which the data recovery operation was performed.

8. The method of claim 7, further comprising:

receiving re-read data for the re-read request from the host memory buffer; and performing an error detection operation on the re-read data.

9. The method of claim 8, further comprising:

based on an error being detected in the re-read data, marking a region corresponding to an HMB address corresponding to the re-read data as a bad region; and remapping the region to an HMB address different from the HMB address corresponding to the re-read data on the host memory buffer.

10. The method of claim 1, wherein updating the address information table comprises:

releasing HMB address information that corresponds to read data in which no error was detected, the HMB address information corresponding to read data in which a correctable error was detected; and maintaining HMB address information corresponding to read data in which an uncorrectable error was detected.

11. A method of operating a storage device using a host memory buffer of a host, the method comprising:

determining to write data to a first host memory buffer (HMB) address;

in response to determining to write the data to the first HMB address, generating, by the storage device, a first write request;

in response to determining to write the data to the first HMB address, recording information on the first HMB address on the host memory buffer corresponding to the first write request for the host memory buffer;

generating a first preliminary read request for the first HMB address and then transmitting the first preliminary read request to the host memory buffer;

receiving, from the host memory buffer, first preliminary read data corresponding to the first preliminary read request;

determining that there is no error in the first preliminary read data; and

in response to determining that there is no error in the first preliminary read data, transmitting the first write request to the host memory buffer.

12. The method of claim 11, further comprising:

in response to determining that there is an error in the first preliminary read data, performing a data recovery operation on the first HMB address.

13. The method of claim 12, wherein performing the data recovery operation comprises:

loading clean data from a nonvolatile memory device in the storage device;

based on data of the first HMB address not being updated after a latest flush operation, writing the clean data in the first HMB address; and based on data of the first HMB address being updated after the latest flush operation, replaying a write access to the first HMB address from the latest flush operation to a time point at which an error was detected, based on journal data on the first HMB address, and wherein the journal data comprises information associated with an address and data of a write request performed on the first HMB address.

14. The method of claim 12, further comprising:

transmitting, to the host memory buffer, the first write request to the host memory buffer after completion of the data recovery operation.

15. The method of claim 12, further comprising:

transmitting a first re-read request for the first HMB address to the host memory buffer after completion of the data recovery operation;

receiving first re-read data on the first re-read request from the host memory buffer; and based on no error being detected in the first re-read data, transmitting the first write request.

16. The method of claim 15, comprising:

based on an error being detected in the first re-read data, marking, in the host memory buffer, the first HMB address as a bad region and remapping the first HMB address to a second HMB address different from the first HMB address.

17. A storage device using a host memory buffer of a host, the storage device comprising a host interface configured to use the host memory buffer as a memory buffer of the storage device; and a storage controller configured to, based on a plurality of read requests being required for the host memory buffer:

record information on host memory buffer (HMB) addresses on the host memory buffer, the HMB addresses respectively corresponding to the plurality of read requests, transmit a first read request of the plurality of read requests to the host memory buffer, before receiving a response from the host memory buffer based on the first read request, transmitting a second read request of the plurality of read requests to the host memory buffer, and detect an error of each of a plurality of pieces of read data, respectively corresponding to the plurality of read requests, received from the host memory buffer.

18. The storage device of claim 17, wherein the storage controller is configured to:

release HMB address information on the host memory buffer, the HMB address information corresponding to read data that does not require a data recovery operation; and maintain HMB address information corresponding to read data requiring the data recovery operation.

19. The storage device of claim 18, wherein the storage controller is configured to:

based on data of the HMB address corresponding to read data having not been updated after a latest flush operation, load clean data into an HMB address corresponding to read data from a nonvolatile memory device in the storage device; and based on the data of the HMB address corresponding to the read data having been updated after the latest flush operation, replay a write access to the host memory buffer from the latest flush operation to a time point, at which the data recovery operation is performed, based on journal data for the HMB address, and the journal data comprises information associated with an address and data of a write request performed on the HMB address.

20. The storage device of claim 17, wherein the storage controller is configured to:

based on a first write request for the host memory buffer being required, record information on a first HMB address on the host memory buffer, corresponding to the first write request, generate a first preliminary read request for the first HMB address and transmit the first preliminary read request to the host memory buffer, and receive first preliminary read data, corresponding to the first preliminary read request, from the host memory buffer, based on no error being detected in the first preliminary read data, transmit the first write request to the host memory buffer.

\* \* \* \* \*